(12) United States Patent
Onodera

(10) Patent No.: US 12,176,881 B2
(45) Date of Patent: Dec. 24, 2024

(54) RADIO FREQUENCY MODULE, COMMUNICATION DEVICE, AND ACOUSTIC WAVE DEVICE

(71) Applicant: Murata Manufacturing Co., Ltd., Kyoto (JP)

(72) Inventor: Syuichi Onodera, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 345 days.

(21) Appl. No.: 17/646,312

(22) Filed: Dec. 29, 2021

(65) Prior Publication Data

US 2022/0123728 A1  Apr. 21, 2022

Related U.S. Application Data

(63) Continuation of application No. PCT/JP2020/024504, filed on Jun. 23, 2020.

(30) Foreign Application Priority Data

Jul. 11, 2019  (JP) .................................. 2019-129663

(51) Int. Cl.
*H04B 1/40* (2015.01)
*H03F 3/24* (2006.01)
(Continued)

(52) U.S. Cl.
CPC ................ *H03H 9/25* (2013.01); *H03F 3/245* (2013.01); *H03H 9/145* (2013.01); *H03H 9/64* (2013.01);
(Continued)

(58) Field of Classification Search
CPC ............ H03H 9/25; H03H 9/145; H03H 9/64; H03H 9/46; H04B 1/40; H03F 3/245; H01L 21/022; H01L 21/02367
See application file for complete search history.

(56) References Cited

U.S. PATENT DOCUMENTS 10,911,024 B2 * 2/2021 Ito ........................ H03H 9/0576
2009/0072383 A1 3/2009 Nakagoshi
(Continued)

FOREIGN PATENT DOCUMENTS

JP  2006-310543 A  11/2006
JP  2014-179476 A  9/2014
(Continued)

OTHER PUBLICATIONS

International Search Report for PCT/JP2020/024504 dated Sep. 29, 2020.
Written Opinion for PCT/JP2020/024504 dated Sep. 29, 2020.

*Primary Examiner* — Tuan Pham
(74) *Attorney, Agent, or Firm* — Pearne & Gordon LLP

(57) ABSTRACT

Reduced in size is a radio frequency component provided on a main surface of a mounting substrate on which an external connection electrode is disposed. A radio frequency module includes a mounting substrate, a first radio frequency component, and an external connection electrode. The mounting substrate has a first main surface and a second main surface opposed to each other. The first radio frequency component has a signal terminal and a ground terminal. The first radio frequency component is provided on the second main surface. The external connection electrode is provided on the second main surface. The first radio frequency component has a third main surface and a fourth main surface opposed to each other. The signal terminal is provided on the third main surface. The ground terminal is provided on the fourth main surface.

8 Claims, 10 Drawing Sheets

(51) Int. Cl.
*H03H 9/145* (2006.01)
*H03H 9/25* (2006.01)
*H03H 9/64* (2006.01)

(52) U.S. Cl.
CPC ......... *H04B 1/40* (2013.01); *H03F 2200/451* (2013.01)

(56) References Cited

U.S. PATENT DOCUMENTS

| | | |
|---|---|---|
| 2014/0262442 A1 | 9/2014 | Nomura et al. |
| 2014/0349596 A1* | 11/2014 | Saji ................. H04B 1/40 455/78 |
| 2015/0123744 A1* | 5/2015 | Nishimura ........... H03H 9/0571 310/365 |
| 2018/0013404 A1* | 1/2018 | Kawasaki .......... H03H 9/02834 |
| 2019/0267339 A1 | 8/2019 | Murase |
| 2020/0044683 A1 | 2/2020 | Nakagawa |
| 2020/0106416 A1 | 4/2020 | Iwamoto |

FOREIGN PATENT DOCUMENTS

| | | |
|---|---|---|
| JP | 2015-109574 A | 6/2015 |
| WO | 2007/138771 A1 | 12/2007 |
| WO | 2018/110513 A1 | 6/2018 |
| WO | 2018/221273 A1 | 12/2018 |
| WO | 2018/235433 A1 | 12/2018 |

\* cited by examiner

RADIO FREQUENCY MODULE, COMMUNICATION DEVICE, AND ACOUSTIC WAVE DEVICE

CROSS REFERENCE TO RELATED APPLICATION

This is a continuation of International Application No. PCT/JP2020/024504 filed on Jun. 23, 2020 which claims priority from Japanese Patent Application No. 2019-129663 filed on Jul. 11, 2019. The contents of these applications are incorporated herein by reference in their entireties.

BACKGROUND ART

Technical Field

The present disclosure generally relates to a radio frequency module, a communication device, and an acoustic wave device and more specifically relates to a radio frequency module including a radio frequency component, a communication device including the radio frequency module, and an acoustic wave device as the radio frequency component.

There has been known a radio frequency module (module) provided with an external connection electrode (external connection conductor) for external connection (refer to Patent Document 1, for example). The radio frequency module described in Patent Document 1 includes a mounting substrate (circuit substrate), a radio frequency component (electronic component), and an external connection electrode.

The mounting substrate has a first main surface and a second main surface (both main surfaces) opposed to each other. One end of the external connection electrode is connected to the second main surface of the mounting substrate. The other end portion of the external connection electrode is provided with a solder bump and is connected to an external mother substrate or the like via the solder bump. Further, on the second main surface of the mounting substrate, a radio frequency component such as a semiconductor element is mounted.

Patent Document 1: Japanese Unexamined Patent Application Publication No. 2014-179476

BRIEF SUMMARY

In the radio frequency module described in Patent Document 1, as the number of radio frequency components mounted on the second main surface of the mounting substrate on which the external connection electrode is mounted increases, it becomes necessary to reduce the radio frequency components in size.

The present disclosure provides a radio frequency module in which a radio frequency component provided on a main surface of a mounting substrate on which an external connection electrode is provided can be reduced in size, a communication device, and an acoustic wave device.

A radio frequency module according to an aspect of the present disclosure includes a mounting substrate, a radio frequency component, and an external connection electrode. The mounting substrate has a first main surface and a second main surface opposed to each other. The radio frequency component has a signal terminal and a ground terminal. The radio frequency component is provided on the second main surface. The external connection electrode is provided on the second main surface. The radio frequency component has a third main surface and a fourth main surface opposed to each other. The signal terminal is provided on the third main surface. The ground terminal is provided on the fourth main surface.

A communication device according to an aspect of the present disclosure includes the radio frequency module and a signal processing circuit. The signal processing circuit is configured to process at least one of a reception signal inputted to an antenna terminal and a transmission signal to be outputted from the antenna terminal.

An acoustic wave device according to an aspect of the present disclosure includes a piezoelectric substrate, an IDT electrode, a signal terminal, and a ground terminal. The piezoelectric substrate has two main surfaces opposed to each other. The IDT electrode is provided on the piezoelectric substrate. The signal terminal is provided on the side of one of the two main surfaces in a thickness direction of the piezoelectric substrate. The ground terminal is provided on the side of the other of the two main surfaces in the thickness direction of the piezoelectric substrate.

With the use of the radio frequency module, the communication device, and the acoustic wave device according to the above aspects of the present disclosure, it is possible to reduce a radio frequency component in size provided on a main surface of a mounting substrate on which an external connection electrode is provided.

DETAILED DESCRIPTION

Hereinafter, a radio frequency module, a communication device, and an acoustic wave device according to Embodiment 1 to Embodiment 5 will be described with reference to the drawings. FIG. 1 and FIG. 3 to FIG. 10 referred to in the following embodiments and the like are all schematic diagrams, and ratios of sizes and thicknesses of respective constituents in the diagrams do not necessarily reflect actual dimensional ratios.

Embodiment 1

(1) Radio Frequency Module

A configuration of a radio frequency module according to Embodiment 1 will be described with reference to the drawings.

Figure 2:
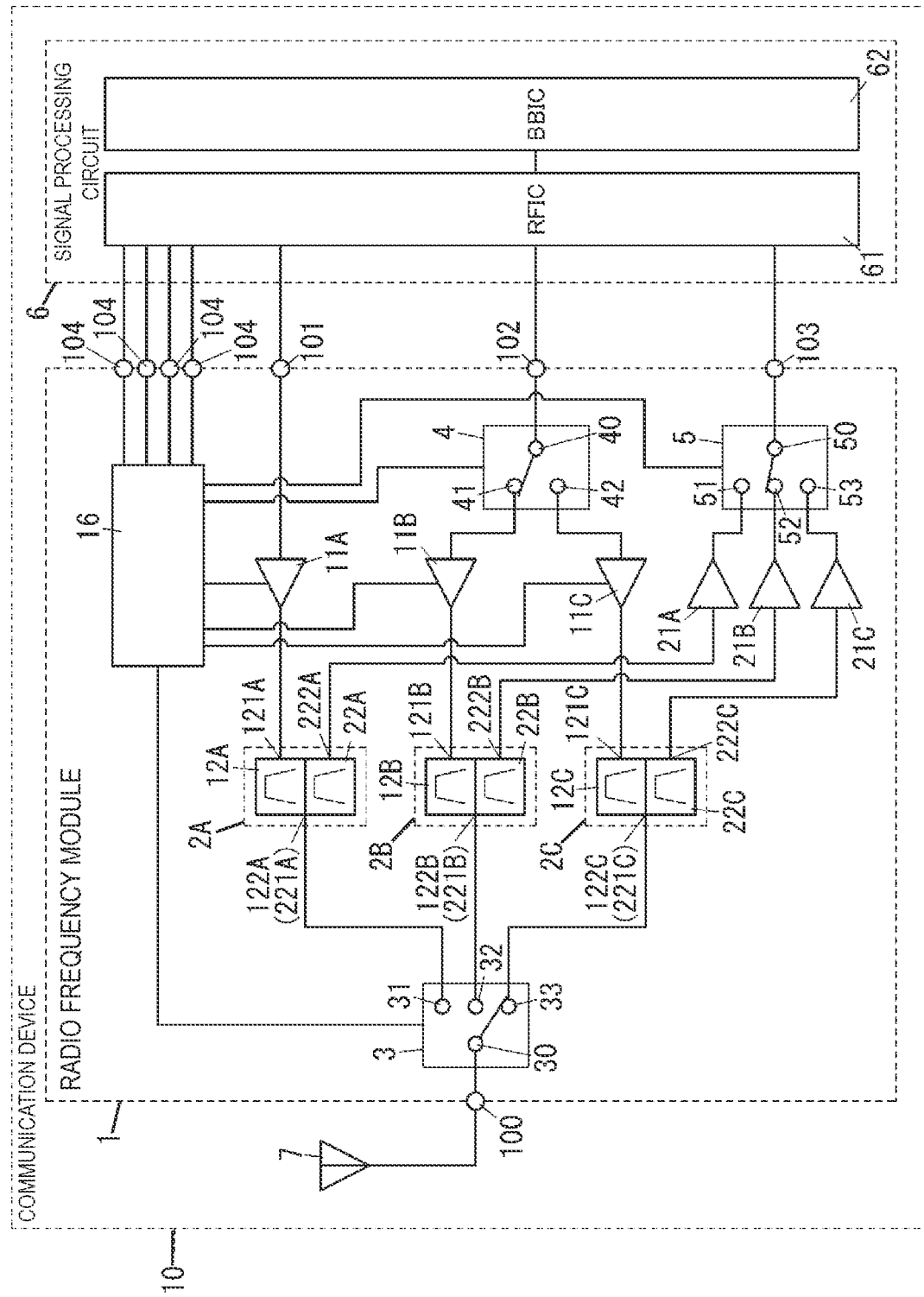
FIG. 2 is a circuit configuration diagram of a communication device including the radio frequency module above.

As illustrated in FIG. 2, a radio frequency module 1 according to Embodiment 1 includes a plurality of (three in the illustrated example) duplexers 2A to 2C, a first switch 3, a second switch 4, and a third switch 5. Further, the radio frequency module 1 includes a plurality of (three in the illustrated example) power amplifiers 11A to 11C, a plurality of (three in the illustrated example) low-noise amplifiers 21A to 21C, and a power amplifier controller 16. Furthermore, the radio frequency module 1 includes an antenna terminal 100, a first input terminal 101, a second input terminal 102, an output terminal 103, and a plurality of (four in the illustrated example) control terminals 104.

Figure 1:
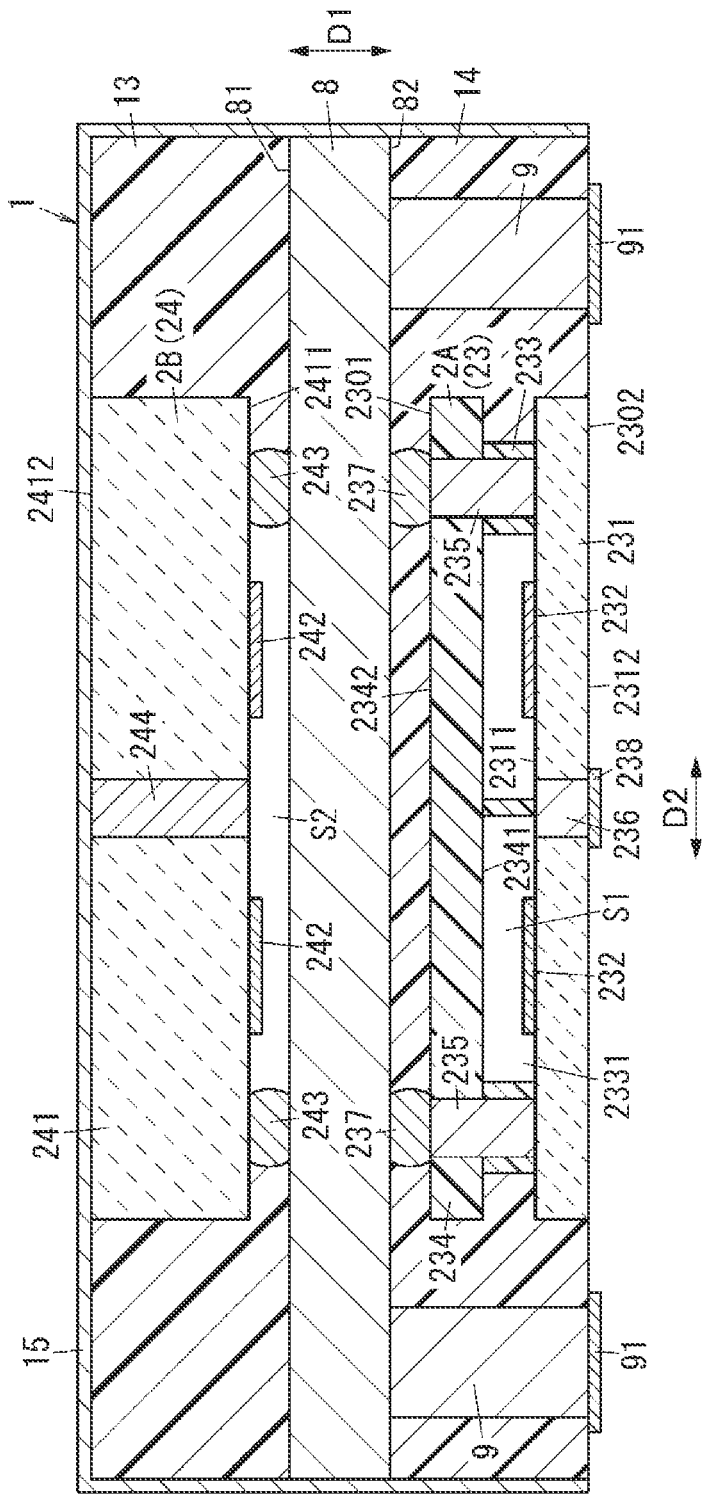
FIG. 1 is a sectional view of a radio frequency module according to Embodiment 1.

Further, as illustrated in FIG. 1, the radio frequency module 1 includes a mounting substrate 8, a plurality of (two in the illustrated example) external connection electrodes 9, a first resin layer 13, a second resin layer 14, and a conductive shield layer 15.

As illustrated in FIG. 2, the radio frequency module 1 is used in a communication device 10, for example. The communication device 10 is a mobile phone such as a smartphone, for example. Note that the communication device 10 is not limited to a mobile phone and may be a wearable terminal such as a smart watch, for example. The radio frequency module 1 is a module capable of supporting Carrier Aggregation and Dual Connectivity.

(2) Circuit Configuration of Radio Frequency Module

Hereinafter, a circuit configuration of the radio frequency module 1 according to Embodiment 1 will be described with reference to FIG. 2.

(2.1) Duplexer

The duplexer 2A includes a first transmission filter 12A and a first reception filter 22A. The duplexer 2B includes a second transmission filter 12B and a second reception filter 22B. The duplexer 2C includes a third transmission filter 12C and a third reception filter 22C.

The first transmission filter 12A is a transmission filter of a first communication band that passes a first transmission signal. The first transmission filter 12A has an input terminal 121A and an output terminal 122A. The input terminal 121A is connected to an output terminal of the power amplifier 11A. The output terminal 122A is connected to a selection terminal 31 of the first switch 3.

The first reception filter 22A is a reception filter of the first communication band that passes a first reception signal. The first reception filter 22A has an input terminal 221A and an output terminal 222A. The input terminal 221A is connected to the selection terminal 31 of the first switch 3. The output terminal 222A is connected to an input terminal of the low-noise amplifier 21A.

In the radio frequency module 1, the output terminal 122A of the first transmission filter 12A and the input terminal 221A of the first reception filter 22A are connected to the same selection terminal 31 of the first switch 3. That is, in the radio frequency module 1, the output terminal 122A of the first transmission filter 12A and the input terminal 221A of the first reception filter 22A are bundled into one.

The first transmission filter 12A and the first reception filter 22A constitute the duplexer 2A having the first communication band as a pass band.

The second transmission filter 12B is a transmission filter of a second communication band that passes a second transmission signal. The second transmission filter 12B has an input terminal 121B and an output terminal 122B. The input terminal 121B is connected to an output terminal of the power amplifier 11B. The output terminal 122B is connected to a selection terminal 32 of the first switch 3.

The second reception filter 22B is a reception filter of the second communication band that passes a second reception signal. The second reception filter 22B has an input terminal 221B and an output terminal 222B. The input terminal 221B is connected to the selection terminal 32 of the first switch 3. The output terminal 222B is connected to an input terminal of the low-noise amplifier 21B.

In the radio frequency module 1, the output terminal 122B of the second transmission filter 12B and the input terminal 221B of the second reception filter 22B are connected to the same selection terminal 32 of the first switch 3. That is, in the radio frequency module 1, the output terminal 122B of the second transmission filter 12B and the input terminal 221B of the second reception filter 22B are bundled into one.

The second transmission filter 12B and the second reception filter 22B constitute the duplexer 2B having the second communication band as a pass band.

The third transmission filter 12C is a transmission filter of a third communication band that passes a third transmission signal. The third transmission filter 12C has an input terminal 121C and an output terminal 122C. The input terminal 121C is connected to an output terminal of the power amplifier 11C. The output terminal 122C is connected to a selection terminal 33 of the first switch 3.

The third reception filter 22C is a reception filter of the third communication band that passes a third reception signal. The third reception filter 22C has an input terminal 221C and an output terminal 222C. The input terminal 221C is connected to the selection terminal 33 of the first switch 3. The output terminal 222C is connected to an input terminal of the low-noise amplifier 21C.

In the radio frequency module 1, the output terminal 122C of the third transmission filter 12C and the input terminal 221C of the third reception filter 22C are connected to the same selection terminal 33 of the first switch 3. That is, in the radio frequency module 1, the output terminal 122C of the third transmission filter 12C and the input terminal 221C of the third reception filter 22C are bundled into one.

The third transmission filter 12C and the third reception filter 22C constitute the duplexer 2C having the third communication band as a pass band.

The first communication band, which is the pass band of the first transmission filter 12A and the first reception filter 22A, is Band 3, for example. The second communication band, which is the pass band of the second transmission filter 12B and the second reception filter 22B, is Bnad 1, for example. The third communication band, which is the pass band of the third transmission filter 12C and the third reception filter 22C, is Bnad 7, for example.

(2.2) Power Amplifier

The power amplifier 11A is an amplifier that amplifies the first transmission signal. The power amplifier 11A is provided between the input terminal 121A of the first transmission filter 12A and the first input terminal 101 in a first transmission path connecting the antenna terminal 100 and the first input terminal 101. The power amplifier 11A has an input terminal and the output terminal. The input terminal of the power amplifier 11A is connected to an external circuit (signal processing circuit 6, for example) via the first input terminal 101. The first input terminal 101 is a terminal for inputting a radio frequency signal (first transmission signal) from the external circuit to the radio frequency module 1. The output terminal of the power amplifier 11A is connected to the input terminal 121A of the first transmission filter 12A.

The power amplifier 11B is an amplifier that amplifies the second transmission signal. The power amplifier 11B is provided between the input terminal 121B of the second transmission filter 12B and a selection terminal 41 of the second switch 4 in a second transmission path connecting the antenna terminal 100 and the second input terminal 102. The power amplifier 11B has an input terminal and the output terminal. The input terminal of the power amplifier 11B is connected to an external circuit (signal processing circuit 6, for example) via the second switch 4 and the second input terminal 102. The second input terminal 102 is a terminal for inputting a radio frequency signal (second transmission signal) from the external circuit to the radio frequency module 1. The output terminal of the power amplifier 11B is connected to the input terminal 121B of the second transmission filter 12B.

The power amplifier 11C is an amplifier that amplifies the third transmission signal. The power amplifier 11C is provided between the input terminal 121C of the third transmission filter 12C and a selection terminal 42 of the second switch 4 in a third transmission path connecting the antenna terminal 100 and the second input terminal 102. The power amplifier 11C has an input terminal and the output terminal. The input terminal of the power amplifier 11C is connected to an external circuit (signal processing circuit 6, for example) via the second switch 4 and the second input terminal 102. The second input terminal 102 is a terminal for inputting a radio frequency signal (third transmission signal) from the external circuit to the radio frequency module 1. The output terminal of the power amplifier 11C is connected to the input terminal 121C of the third transmission filter 12C.

Each of the plurality of power amplifiers 11A to 11C is controlled by the power amplifier controller 16, for example, but may be controlled by an RF signal processing circuit 61 of the signal processing circuit 6 which will be described later, for example.

(2.3) Low-Noise Amplifier

The low-noise amplifier 21A is an amplifier that amplifies the first reception signal with low noise. The low-noise amplifier 21A is provided between the output terminal 222A of the first reception filter 22A and a selection terminal 51 of the third switch 5 in the first reception path connecting the antenna terminal 100 and the output terminal 103. The low-noise amplifier 21A has the input terminal and an output terminal. The input terminal of the low-noise amplifier 21A is connected to the output terminal 222A of the first reception filter 22A. The output terminal of the low-noise amplifier 21A is connected to an external circuit (signal processing circuit 6, for example) via the third switch 5 and the output terminal 103. The output terminal 103 is a terminal for outputting a radio frequency signal from one of the plurality of low-noise amplifiers 21A to 21C which is selected by the third switch 5 to the external circuit. For example, when the selection terminal 31 of the third switch 5 is selected, the first reception signal (radio frequency signal) is outputted to the external circuit via the output terminal 103.

The low-noise amplifier 21B is an amplifier that amplifies the second reception signal with low noise. The low-noise amplifier 21B is provided between the output terminal 222B of the second reception filter 22B and a selection terminal 52 of the third switch 5 in the second reception path connecting the antenna terminal 100 and the output terminal 103. The low-noise amplifier 21B has the input terminal and an output terminal. The input terminal of the low-noise amplifier 21B is connected to the output terminal 222B of the second reception filter 22B. The output terminal of the low-noise amplifier 21B is connected to an external circuit (signal processing circuit 6, for example) via the third switch 5 and the output terminal 103. For example, when the selection terminal 32 of the third switch 5 is selected, the second reception signal (radio frequency signal) is outputted to the external circuit via the output terminal 103.

The low-noise amplifier 21C is an amplifier that amplifies the third reception signal with low noise. The low-noise amplifier 21C is provided between the output terminal 222C of the third reception filter 22C and a selection terminal 53 of the third switch 5 in the third reception path connecting the antenna terminal 100 and the output terminal 103. The low-noise amplifier 21C has the input terminal and an output terminal. The input terminal of the low-noise amplifier 21C is connected to the output terminal 222C of the third reception filter 22C. The output terminal of the low-noise amplifier 21C is connected to an external circuit (signal processing circuit 6, for example) via the third switch 5 and the output terminal 103. For example, when the selection terminal 33 of the third switch 5 is selected, the third reception signal (radio frequency signal) is outputted to the external circuit via the output terminal 103.

(2.4) Switch

The first switch 3 includes a common terminal 30 and a plurality of (three in the illustrated example) selection terminals 31 to 33. The common terminal 30 is connected to the antenna terminal 100. The selection terminal 31 is connected to the duplexer 2A. More specifically, the selection terminal 31 is connected to the output terminal 122A of the first transmission filter 12A and the input terminal 221A of the first reception filter 22A. The selection terminal 32 is connected to the duplexer 2B. More specifically, the selection terminal 32 is connected to the output terminal 122B of the second transmission filter 12B and the input terminal 221B of the second reception filter 22B. The selection terminal 33 is connected to the duplexer 2C. More specifically, the selection terminal 33 is connected to the output terminal 122C of the third transmission filter 12C and the input terminal 221C of the third reception filter 22C. An antenna 7 is connected to the antenna terminal 100.

The first switch 3 switches connection states between the common terminal 30 and a plurality of selection terminals 31 to 33. The first switch 3 is controlled by, for example, the power amplifier controller 16 but may be controlled by, for example, the RF signal processing circuit 61 of the signal processing circuit 6. The first switch 3 electrically connects the common terminal 30 and at least one of the plurality of selection terminals 31 to 33 in accordance with a control signal from the power amplifier controller 16. That is, the first switch 3 is a switch capable of one-to-one and one-to-many connection.

The second switch 4 has a common terminal 40 and a plurality of (two in the illustrated example) selection terminals 41 and 42. The common terminal 40 is connected to the second input terminal 102. The selection terminal 41 is connected to the power amplifier 11B. The selection terminal 42 is connected to the power amplifier 11C.

The second switch 4 switches connection states between the common terminal 40 and the plurality of selection terminals 41 and 42. The second switch 4 is controlled by the power amplifier controller 16, for example, but may be controlled by the RF signal processing circuit 61 of the signal processing circuit 6. The second switch 4 electrically connects the common terminal 40 and at least one of the plurality of selection terminals 41 and 42 in accordance with a control signal from the power amplifier controller 16. That is, the second switch 4 is a switch capable of one-to-one and one-to-many connection.

The third switch 5 includes a common terminal 50 and a plurality of (three in the illustrated example) selection terminals 51 to 53. The common terminal 50 is connected to the output terminal 103. The selection terminal 51 is connected to the low-noise amplifier 21A. The selection terminal 52 is connected to the low-noise amplifier 21B. The selection terminal 53 is connected to the low-noise amplifier 21C.

The third switch 5 switches connection states between the common terminal 50 and the plurality of selection terminals 51 to 53. The third switch 5 is controlled by the power amplifier controller 16, for example, but may be controlled by the RF signal processing circuit 61 of the signal processing circuit 6. The third switch 5 electrically connects the common terminal 50 and at least one of the plurality of selection terminals 51 to 53 in accordance with a control signal from the power amplifier controller 16. That is, the third switch 5 is a switch capable of one-to-one and one-to-many connection.

(2.5) Power Amplifier Controller

The power amplifier controller 16 controls the first switch 3, the second switch 4, the third switch 5, and the plurality of power amplifiers 11A to 11C, for example. The power amplifier controller 16 controls the first switch 3 by outputting a first control signal to the first switch 3. The power amplifier controller 16 controls the second switch 4 by outputting a second control signal to the second switch 4. The power amplifier controller 16 controls the third switch 5 by outputting a third control signal to the third switch 5. The power amplifier controller 16 controls each of the power amplifiers 11A to 11C by outputting a fourth control signal to each of the power amplifiers 11A to 11C.

(3) Communication Device

As illustrated in FIG. 2, the communication device 10 includes the radio frequency module 1, the signal processing circuit 6, and the antenna 7.

The antenna 7 is connected to the antenna terminal 100 of the radio frequency module 1. The antenna 7 has a transmission function of radiating at least one of the first transmission signal, the second transmission signal, and the third transmission signal outputted from the radio frequency module 1 as a radio wave and a reception function of receiving at least one of the first reception signal, the second reception signal, and the third reception signal from the outside as a radio wave and outputting the reception signal to the radio frequency module 1.

The signal processing circuit 6 includes the RF signal processing circuit 61 and a baseband signal processing circuit 62. The signal processing circuit 6 processes the first transmission signal, the second transmission signal, the third transmission signal, the first reception signal, the second reception signal, and the third reception signal.

The RF signal processing circuit 61 is a radio frequency integrated circuit (RFIC), for example, and performs signal processing on a radio frequency signal.

The RF signal processing circuit 61 performs signal processing such as up-conversion on a radio frequency signal outputted from the baseband signal processing circuit 62 and outputs the radio frequency signal subjected to the signal processing to the radio frequency module 1. Specifically, the RF signal processing circuit 61 performs signal processing such as up-conversion on the first transmission signal outputted from the baseband signal processing circuit 62 and outputs the first transmission signal subjected to the signal processing to the first transmission path of the radio frequency module 1. Further, the RF signal processing circuit 61 performs signal processing such as up-conversion on the second transmission signal outputted from the baseband signal processing circuit 62 and outputs the second transmission signal subjected to the signal processing to the second transmission path of the radio frequency module 1. Furthermore, the RF signal processing circuit 61 performs signal processing such as up-conversion on the third transmission signal outputted from the baseband signal processing circuit 62 and outputs the third transmission signal subjected to the signal processing to the third transmission path of the radio frequency module 1.

The RF signal processing circuit 61 performs signal processing such as down-conversion on a radio frequency signal outputted from the radio frequency module 1 and outputs the radio frequency signal subjected to the signal processing to the baseband signal processing circuit 62. Specifically, the RF signal processing circuit 61 performs signal processing on the first reception signal outputted from the first reception path of the radio frequency module 1 and outputs the first reception signal subjected to the signal processing to the baseband signal processing circuit 62. Further, the RF signal processing circuit 61 performs signal processing on the second reception signal outputted from the second reception path of the radio frequency module 1 and outputs the second reception signal subjected to the signal processing to the baseband signal processing circuit 62. Furthermore, the RF signal processing circuit 61 performs signal processing on the third reception signal outputted from the third reception path of the radio frequency module 1 and outputs the third reception signal subjected to the signal processing to the baseband signal processing circuit 62.

The baseband signal processing circuit 62 is a baseband integrated circuit (BBIC) and performs predetermined signal processing on a transmission signal from the outside of the signal processing circuit 6, for example. The reception signal processed by the baseband signal processing circuit 62 is used as an image signal for displaying an image as an image signal or an audio signal for a call, for example.

The RF signal processing circuit 61 also has a function as a control unit that controls the plurality of low-noise amplifiers 21A to 21C included in the radio frequency module 1 based on a communication band (frequency band) to be used. Specifically, the RF signal processing circuit 61 controls the plurality of low-noise amplifiers 21A to 21C by control signals. Note that the control unit may be provided outside the RF signal processing circuit 61 and may be provided in the radio frequency module 1 or the baseband signal processing circuit 62, for example.

(4) Structure of Radio Frequency Module

Hereinafter, the structure of the radio frequency module 1 according to Embodiment 1 will be described with reference to the drawings.

As illustrated in FIG. 1, the radio frequency module 1 includes the mounting substrate 8, a plurality of (two in the illustrated example) external connection electrodes 9, the first resin layer 13, the second resin layer 14, and the conductive shield layer 15.

The radio frequency module 1 may electrically be connected to an external substrate (not illustrated). The external substrate corresponds to a mother substrate of, for example, a mobile phone and a communication device. In the present specification and the like, "the radio frequency module 1 may electrically be connected to an external substrate" includes not only a case in which the radio frequency module 1 is directly mounted on the external substrate but also a case in which the radio frequency module 1 is indirectly mounted on the external substrate. Further, in the present specification and the like, the "case in which the radio frequency module 1 is indirectly mounted on the external substrate" refers to a case in which the radio frequency module 1 is mounted on another radio frequency module mounted on the external substrate.

(4.1) Mounting Substrate

As illustrated in FIG. 1, the mounting substrate 8 has a first main surface 81 and a second main surface 82. The first main surface 81 and the second main surface 82 are opposed to each other in a first direction D1, which is the thickness direction of the mounting substrate 8. The second main surface 82 faces an external substrate (not illustrated) when the radio frequency module 1 is provided on the external substrate. The mounting substrate 8 is a double-sided mounting substrate in which circuit components are mounted on each of the first main surface 81 and the second main surface 82.

The mounting substrate 8 is, for example, a printed wiring board or a low temperature co-fired ceramics (LTCC) substrate. Here, the mounting substrate 8 is a multilayer substrate including a plurality of dielectric layers and a plurality of conductor pattern portions. The plurality of dielectric layers and the plurality of conductor pattern portions are laminated in the first direction D1, which is the thickness direction of the mounting substrate 8. The plurality of conductor pattern portions are each formed in a predetermined pattern. Each of the plurality of conductor pattern portions includes one or a plurality of conductor portions in one plane orthogonal to the first direction D1. The material of each conductor pattern portion is copper, for example.

The duplexer 2B is disposed on the first main surface 81 of the mounting substrate 8. The duplexer 2A is disposed on the second main surface 82 of the mounting substrate 8. Further, the plurality of external connection electrodes 9 is disposed on the second main surface 82 of the mounting substrate 8. The duplexer 2C, the first switch 3, the second switch 4, the third switch 5, the plurality of power amplifiers 11A to 11C, the power amplifier controller 16, and the plurality of low-noise amplifiers 21A to 21C are omitted in the drawing but are each disposed on the first main surface 81 or the second main surface 82 of the mounting substrate 8.

(4.2) Second Radio Frequency Component

As illustrated in FIG. 1, the duplexer 2B is disposed on the first main surface 81 of the mounting substrate 8. That is, in the radio frequency module 1 illustrated in FIG. 1, a circuit element disposed on the first main surface 81 of the mounting substrate 8 is the duplexer 2B.

As described above, the duplexer 2B is a one-chip filter including the second transmission filter 12B and the second reception filter 22B. The duplexer 2B corresponds to a second radio frequency component 24 provided on the first main surface 81 of the mounting substrate 8.

The second transmission filter 12B is an acoustic wave filter including a plurality of series arm resonators and a plurality of parallel arm resonators, for example. The acoustic wave filter is a surface acoustic wave (SAW) filter using a surface acoustic wave, for example. Note that, the second transmission filter 12B may include at least one of an inductor and a capacitor connected in series with any of the plurality of series arm resonators or may include an inductor or a capacitor connected in series with any of the plurality of parallel arm resonators.

Similarly, the second reception filter 22B is an acoustic wave filter including a plurality of series arm resonators and a plurality of parallel arm resonators, for example. The acoustic wave filter is a SAW filter using a surface acoustic wave, for example. Note that, the second reception filter 22B may include at least one of an inductor and a capacitor connected in series with any of the plurality of series arm resonators or may include an inductor or a capacitor connected in series with any of the plurality of parallel arm resonators.

As illustrated in FIG. 1, the second radio frequency component 24 is an acoustic wave device (hereinafter, also referred to as "acoustic wave device 24") including a piezoelectric substrate 241 and a plurality of (two in the illustrated example) interdigital transducer (IDT) electrodes 242, for example. Further, the acoustic wave device (second radio frequency component) 24 includes a plurality of (two in the illustrated example) signal terminals 243 and a through-electrode 244.

The piezoelectric substrate 241 has a first main surface 2411 and a second main surface 2412. The first main surface 2411 and the second main surface 2412 are opposed to each other in the first direction D1, which is the thickness direction of the piezoelectric substrate 241. The first main surface 2411 of the piezoelectric substrate 241 faces the first main surface 81 of the mounting substrate 8 when the acoustic wave device 24 is provided on the first main surface 81 of the mounting substrate 8. The piezoelectric substrate 241 is a lithium tantalate substrate or a lithium niobate substrate, for example.

The plurality of IDT electrodes 242 is disposed on the first main surface 2411 of the piezoelectric substrate 241. In the present specification and the like, "disposed on the first main surface 2411 of the piezoelectric substrate 241" includes a case of being directly disposed on the first main surface 2411 and a case of being indirectly disposed on the first main surface 2411.

The material of each of the plurality of IDT electrodes 242 is an appropriate metal material, such as aluminum, copper, platinum, gold, silver, titanium, nickel, chromium, molybdenum, or tungsten, or an alloy containing any of these metals as a main component, for example. Further, each IDT electrode 242 may have a structure in which a plurality of metal films made of these metals or alloys is laminated. One (left side in FIG. 1, for example) of the plurality of IDT electrodes 242 corresponds to the second transmission filter 12B, for example. Further, the other (right side in FIG. 1, for example) of the plurality of IDT electrodes 242 corresponds to the second reception filter 22B, for example.

The plurality of signal terminals 243 is disposed on the first main surface 2411 of the piezoelectric substrate 241. Each of the plurality of signal terminals 243 is a solder bump, for example. Each of the plurality of signal terminals 243 is not limited to a solder bump and may be a gold bump, for example. One (left side in FIG. 1, for example) of the plurality of signal terminals 243 is connected to the input terminal 121B of the second transmission filter 12B, for example. Further, the other (right side in FIG. 1, for example) of the plurality of signal terminals 243 is connected to the output terminal 222B of the second reception filter 22B, for example.

Here, a space S2 surrounded by the piezoelectric substrate 241 and the plurality of signal terminals 243 is filled with nitrogen or air, for example.

The through-electrode 244 penetrates through the piezoelectric substrate 241 in the first direction D1, which is the thickness direction of the piezoelectric substrate 241. The through-electrode 244 has a first end portion and a second end portion which are two end portions in the first direction D1. The first end portion of the through-electrode 244 is connected to the ground of a parallel arm resonator constituting part of the second transmission filter 12B and the second reception filter 22B, for example. The second end portion of the through-electrode 244 is connected to the conductive shield layer 15. That is, the through-electrode 244 functions as a ground electrode by being connected to the conductive shield layer 15. The through-electrode 244 is formed of an appropriate metal material, such as copper, nickel, or an alloy containing any of these metals as a main component, for example.

(4.3) First Radio Frequency Component

As illustrated in FIG. 1, the duplexer 2A is disposed on the second main surface 82 of the mounting substrate 8. That is, in the radio frequency module 1 illustrated in FIG. 1, a circuit element disposed on the second main surface 82 of the mounting substrate 8 is the duplexer 2A.

As described above, the duplexer 2A is a one-chip filter including the first transmission filter 12A and the first reception filter 22A. The duplexer 2A corresponds to a first radio frequency component (radio frequency component) 23 provided on the second main surface 82 of the mounting substrate 8.

The first transmission filter 12A is an acoustic wave filter including a plurality of series arm resonators and a plurality of parallel arm resonators, for example. The acoustic wave filter is a SAW filter using a surface acoustic wave, for example. Note that, the first transmission filter 12A may include at least one of an inductor and a capacitor connected in series with any of the plurality of series arm resonators or may include an inductor or a capacitor connected in series with any of the plurality of parallel arm resonators.

Similarly, the first reception filter 22A is an acoustic wave filter including a plurality of series arm resonators and a plurality of parallel arm resonators, for example. The acoustic wave filter is a SAW filter using a surface acoustic wave, for example. Note that, the first reception filter 22A may include at least one of an inductor and a capacitor connected in series with any of the plurality of series arm resonators or may include an inductor or a capacitor connected in series with any of the plurality of parallel arm resonators.

As illustrated in FIG. 1, the first radio frequency component 23 is an acoustic wave device (hereinafter, also referred to as "acoustic wave device 23") including a piezoelectric substrate 231, a plurality of (two in the illustrated example) IDT electrodes 232, a spacer layer 233, and a cover layer 234, for example. Further, the acoustic wave device (first radio frequency component) 23 includes a plurality of (three in the illustrated example) through-electrodes 235 and 236, a plurality of (two in the illustrated example) signal terminals 237, and a ground terminal 238.

The piezoelectric substrate 231 has a first main surface 2311 and a second main surface 2312. The first main surface 2311 and the second main surface 2312 are opposed to each other in the first direction D1, which is the thickness direction of the piezoelectric substrate 231. The second main surface 2312 of the piezoelectric substrate 231 faces an external substrate (not illustrated) when the radio frequency module 1 is provided on the external substrate. The piezoelectric substrate 231 is, for example, a lithium tantalate substrate or a lithium niobate substrate. In the present embodiment, the second main surface 2312 of the piezoelectric substrate 231 corresponds to a fourth main surface 2302 of the first radio frequency component 23.

The plurality of IDT electrodes 232 is disposed on the first main surface 2311 of the piezoelectric substrate 231. The material of each of the plurality of IDT electrodes 232 is an appropriate metal material, such as aluminum, copper, platinum, gold, silver, titanium, nickel, chromium, molybdenum, or tungsten, or an alloy containing any of these metals as a main component, for example. Further, each IDT electrode 232 may have a structure in which a plurality of metal films made of these metals or alloys is laminated. One (left side in FIG. 1, for example) of the plurality of IDT electrodes 232 corresponds to the first transmission filter 12A, for example. Further, the other (right side in FIG. 1, for example) of the plurality of IDT electrodes 232 corresponds to the first reception filter 22A, for example.

The spacer layer 233 is provided on the first main surface 2311 of the piezoelectric substrate 231. The spacer layer 233 has a rectangular frame shape in plan view from the first direction D1, which is the thickness direction of the piezoelectric substrate 231, and surrounds the plurality of IDT electrodes 232. The spacer layer 233 has a through-hole 2331 that exposes the IDT electrodes 232. The spacer layer 233 has an electrical insulation property. The material of the spacer layer 233 is a synthetic resin such as an epoxy resin or a polyimide-based resin, for example.

As illustrated in FIG. 1, the cover layer 234 is provided over the spacer layer 233 so as to close the through-hole 2331 of the spacer layer 233. The cover layer 234 has a first main surface 2341 on the side of the spacer layer 233 and a second main surface 2342 opposed to the first main surface 2341. The cover layer 234 has a flat plate shape. The cover layer 234 has an electrical insulation property. The material of the cover layer 234 is a synthetic resin such as an epoxy-based resin or a polyimide-based resin, for example. Note that the cover layer 234 may be formed of a single material or a plurality of materials. Further, the cover layer 234 may be formed of an appropriate electrical insulation material other than the resin above. In the present embodiment, the second main surface 2342 of the cover layer 234 corresponds to a third main surface 2301 of the first radio frequency component 23. The third main surface 2301 is positioned between the second main surface 82 of the mounting substrate 8 and the fourth main surface 2302 of the first radio frequency component 23 in the first direction D1, which is the thickness direction of the mounting substrate 8.

Here, a space S1 surrounded by the piezoelectric substrate 231, the spacer layer 233, and the cover layer 234 is filled with nitrogen or air, for example.

Each of the plurality of through-electrodes 235 penetrates through the spacer layer 233 and the cover layer 234 in the first direction D1, which is the thickness direction of the piezoelectric substrate 231. Each of the plurality of through-electrodes 235 has a cylindrical shape, for example. Each of the plurality of through-electrodes 235 is formed of an appropriate metal material, such as copper, nickel, or an alloy containing any of these metals as a main component, for example.

The through-electrode 236 penetrates through the piezoelectric substrate 231 in the first direction D1, which is the thickness direction of the piezoelectric substrate 231. The through-electrode 236 has a cylindrical shape, for example. The through-electrode 236 is formed of an appropriate metal material, such as copper, nickel, or an alloy containing any of these metals as a main component, for example.

As illustrated in FIG. 1, the plurality of signal terminals 237 is provided on the second main surface 2342 of the cover layer 234. The plurality of signal terminals 237 and the through-electrodes 235 correspond to each other on a one-to-one basis. Each of the plurality of signal terminals 237 is connected to corresponding one of the plurality of through-electrodes 235. Each of the plurality of signal terminals 237 is a solder bump, for example. Each of the plurality of signal terminals 237 is not limited to a solder bump and may be a gold bump, for example. One (left side in FIG. 1, for example) of the plurality of signal terminals 237 is connected to the input terminal 121A of the first transmission filter 12A, for example. Further, the other (right side in FIG. 1, for example) of the plurality of signal terminals 237 is connected to the output terminal 222A of the first reception filter 22A, for example. In Embodiment 1, the first radio frequency component 23 has the plurality of signal terminals 237, but it is sufficient that the first radio frequency component 23 has at least one signal terminal 237.

The ground terminal 238 is provided on the second main surface 2312 of the piezoelectric substrate 231. The ground terminal 238 is connected to the through-electrode 236. The through-electrode 236 is connected to the ground of a parallel arm resonator constituting part of the first transmission filter 12A and the first reception filter 22A at the end portion opposite to the ground terminal 238, for example. The ground terminal 238 is formed of an appropriate metal material, such as copper, nickel, or an alloy containing any of these metals as a main component, for example.

(4.4) External Connection Electrode

As illustrated in FIG. 1, the plurality of external connection electrodes 9 is an electrode for electrically connecting the mounting substrate 8 and an external substrate (not illustrated). The plurality of external connection electrodes 9 includes the antenna terminal 100, the first input terminal 101, the second input terminal 102, and the output terminal 103 illustrated in FIG. 2 and a plurality of ground electrodes.

The plurality of external connection electrodes 9 is disposed on the second main surface 82 of the mounting substrate 8. The plurality of external connection electrodes 9 is a columnar (cylindrical, for example) electrode provided on the second main surface 82 of the mounting substrate 8. The material of the plurality of external connection electrodes 9 is a metal (such as copper, copper alloy), for example. Each of the plurality of external connection electrodes 9 has a proximal end portion bonded to the second main surface 82 of the mounting substrate 8 and a tip end portion opposite to the proximal end portion in the first direction D1, which is the thickness direction of the mounting substrate 8. The tip end portion of each of the plurality of external connection electrodes 9 may include a gold plating layer, for example. An external connection terminal 91 is provided at the tip end portion of each of the plurality of external connection electrodes 9.

In the radio frequency module 1, the plurality of external connection electrodes 9 is provided from the viewpoint of the ease of mounting of the radio frequency module 1 on a mother substrate, the increase of the number of ground electrodes of the radio frequency module 1, and the like.

(4.5) First Resin Layer and Second Resin Layer

As illustrated in FIG. 1, the first resin layer 13 is provided on the first main surface 81 of the mounting substrate 8. The first resin layer 13 covers a circuit element disposed on the first main surface 81 and the first main surface 81 of the mounting substrate 8. The first resin layer 13 has a function of ensuring reliability in mechanical strength, moisture resistance, and the like of the circuit element disposed on the first main surface 81.

As illustrated in FIG. 1, the second resin layer 14 is provided on the second main surface 82 of the mounting substrate 8. The second resin layer 14 covers a circuit element disposed on the second main surface 82 and the second main surface 82 of the mounting substrate 8. The second resin layer 14 has a function of ensuring reliability in mechanical strength, moisture resistance, and the like of the circuit element disposed on the second main surface 82.

(4.6) Conductive Shield Layer

As illustrated in FIG. 1, the conductive shield layer 15 is provided so as to cover the entirety except for the front surface (lower surface in FIG. 1) of the second resin layer 14 in the first direction D1, which is the thickness direction of the mounting substrate 8. The conductive shield layer 15 is a layer for suppressing the intrusion of noise from the outside and suppressing the emission of noise to the outside.

The conductive shield layer 15 includes a conductive layer, an adhesion layer, and a protection layer, for example. The material of each of the adhesion layer and the protection layer is, for example, stainless, titanium, chromium, or nickel. The material of the conductive layer is, for example, copper, silver, or aluminum. Note that the adhesion layer may be omitted. The thickness of the conductive shield layer 15 is 8 μm, for example.

(5) Effect

In the radio frequency module 1 according to Embodiment 1, as described above, the signal terminals 237 are provided on the third main surface 2301 of the first radio frequency component (radio frequency component) 23, and the ground terminal 238 is provided on the fourth main surface 2302 of the first radio frequency component 23. That is, in the radio frequency module 1 according to Embodiment 1, the signal terminals 237 and the ground terminal 238 are provided on the different main surfaces of the first radio frequency component 23. With this, it is possible to reduce the first radio frequency component 23 in size as compared with a case in which the signal terminals 237 and the ground terminal 238 are provided on the same main surface (third main surface 2301 or fourth main surface 2302).

(6) Modifications

Modifications of Embodiment 1 will be described below. Modifications described below can be applied in combination with Embodiment 1 as appropriate.

(6.1) Modification 1

In the radio frequency module 1 according to Embodiment 1, as illustrated in FIG. 1, the second resin layer 14 is provided on the side of the second main surface 82 of the mounting substrate 8 so as to cover the acoustic wave device (duplexer) 2A disposed on the second main surface 82. Further, the radio frequency module 1 includes the plurality of external connection electrodes 9 formed in a cylindrical shape and is connected to an external substrate with the plurality of external connection electrodes 9.

Figure 3:
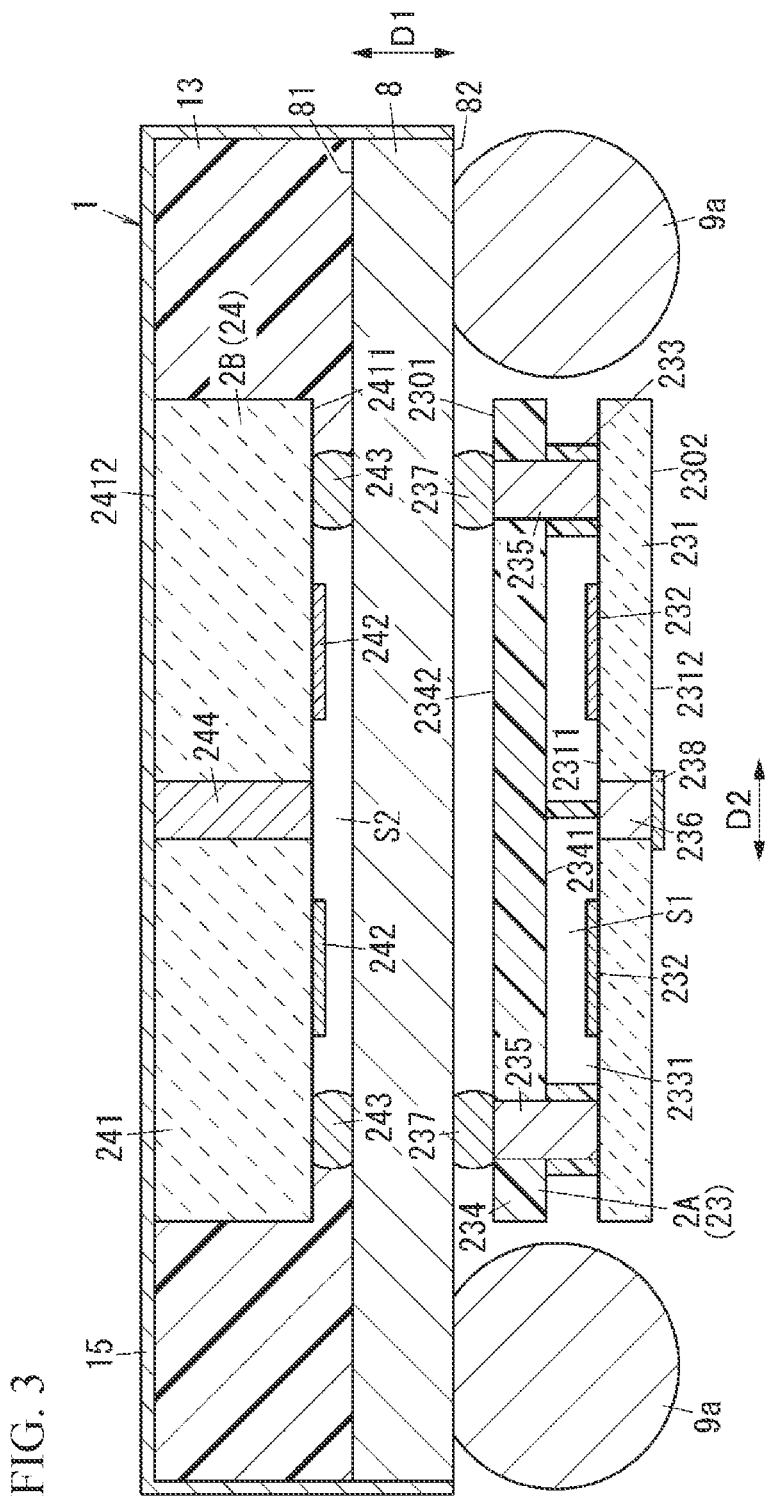
FIG. 3 is a sectional view of a radio frequency module according to Modification 1 of Embodiment 1.

Whereas, as in the radio frequency module 1 illustrated in FIG. 3, the second resin layer may be omitted on the side of the second main surface 82 of the mounting substrate 8, and the radio frequency module 1 may be connected to an external substrate by a plurality of external connection electrodes 9a formed in a spherical shape.

Each of the plurality of external connection electrodes 9a is a ball bump formed in a spherical shape, for example. The material of the ball bump is, for example, gold, copper, or solder.

(6.2) Modification 2

A radio frequency module 1A according to Modification 2 will be described with reference to FIG. 4. In the radio frequency module 1A according to Modification 2, the structure of a first radio frequency component 23A constituting the duplexer 2A is different from that of the first radio frequency component 23 of the radio frequency module 1 according to Embodiment 1. Other configurations are the same as those of the radio frequency module 1 according to Embodiment 1, and the same constituents are denoted with the same reference signs and the description thereof is omitted.

Figure 4:
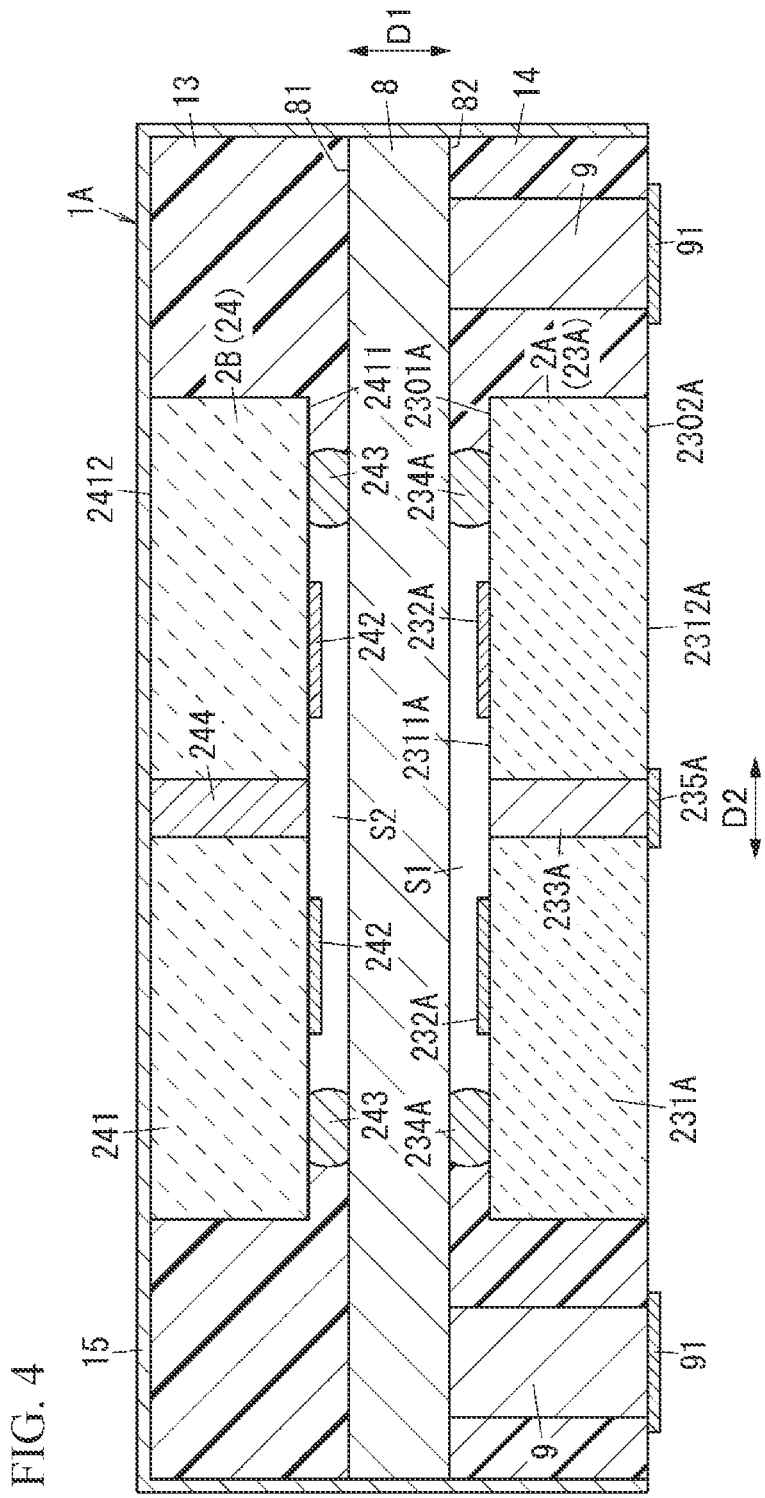
FIG. 4 is a sectional view of a radio frequency module according to Modification 2 of Embodiment 1.

As illustrated in FIG. 4, the radio frequency module 1A according to Modification 2 includes the mounting substrate 8, the first radio frequency component 23A, the second radio frequency component 24, the plurality of (two in the illustrated example) external connection electrodes 9, the first resin layer 13, the second resin layer 14, and the conductive shield layer 15.

The first radio frequency component 23A is an acoustic wave device (hereinafter also referred to as "acoustic wave device 23A") including a piezoelectric substrate 231A and a plurality of (two in the illustrated example) IDT electrodes 232A, for example. Further, the acoustic wave device (first radio frequency component) 23A includes a through-electrode 233A, a plurality of (two in the illustrated example) signal terminals 234A, and a ground terminal 235A.

The piezoelectric substrate 231A has a first main surface 2311A and a second main surface 2312A. The first main surface 2311A and the second main surface 2312A are opposed to each other in the first direction D1, which is the thickness direction of the piezoelectric substrate 231A. The first main surface 2311A of the piezoelectric substrate 231A faces the second main surface 82 of the mounting substrate 8 on which the acoustic wave device 23A is provided on the second main surface 82 of the mounting substrate 8. The piezoelectric substrate 231A is, for example, a lithium tantalate substrate or a lithium niobate substrate. In the present embodiment, the first main surface 2311A of the piezoelectric substrate 231A corresponds to a third main surface 2301A of the first radio frequency component 23A, and the second main surface 2312A of the piezoelectric substrate 231A corresponds to a fourth main surface 2302A of the first radio frequency component 23A. In the radio frequency module 1A according to Modification 2, the third main surface 2301A of the first radio frequency component 23A is positioned between the second main surface 82 of the mounting substrate 8 and the fourth main surface 2302A of the first radio frequency component 23A in the first direction D1, which is the thickness direction of the mounting substrate 8.

The plurality of IDT electrodes 232A is disposed on the first main surface 2311A of the piezoelectric substrate 231A. In the present specification and the like, "disposed on the first main surface 2311A of the piezoelectric substrate 231A" includes a case of being directly disposed on the first main surface 2311A and a case of being indirectly disposed on the first main surface 2311A.

The material of each of the plurality of IDT electrodes 232A is an appropriate metal material, such as aluminum, copper, platinum, gold, silver, titanium, nickel, chromium, molybdenum, or tungsten, or an alloy containing any of these metals as a main component, for example. Further, each IDT electrode 232A may have a structure in which a plurality of metal films made of these metals or alloys is laminated. One (left side in FIG. 3, for example) of the plurality of IDT electrodes 232A corresponds to the first transmission filter 12A, for example. Further, the other (right side in FIG. 3, for example) of the plurality of IDT electrodes 232A corresponds to the first reception filter 22A, for example.

The through-electrode 233A penetrates through the piezoelectric substrate 231A in the first direction D1, which is the thickness direction of the piezoelectric substrate 231A. The through-electrode 233A has a cylindrical shape, for example. The through-electrode 233A has a first end portion and a second end portion, which are two end portions in the first direction D1, which is the thickness direction of the piezoelectric substrate 231A. The first end portion (upper end portion in FIG. 4) of the through-electrode 233A is connected to the ground of a parallel arm resonator constituting part of the first transmission filter 12A and the first reception filter 22A, for example. The second end portion (lower end portion in FIG. 4) of the through-electrode 233A is connected to the ground terminal 235, for example. The through-electrode 233A is formed of an appropriate metal material, such as copper, nickel, or an alloy containing any of these metals as a main component, for example.

The plurality of signal terminals 234A is disposed on the first main surface 2311A of the piezoelectric substrate 231A. Each of the plurality of signal terminals 234A is a solder bump, for example. Each of the plurality of signal terminals 234A is not limited to a solder bump and may be a gold bump, for example. One (left side in FIG. 3, for example) of the plurality of signal terminals 234A is connected to the input terminal 121A of the first transmission filter 12A, for example. Further, the other (right side in FIG. 3, for example) of the plurality of signal terminals 234A is connected to the output terminal 222A of the first reception filter 22A, for example. In Modification 2, the first radio frequency component 23A has the plurality of signal terminals 234A, but it is sufficient that the first radio frequency component 23A has at least one signal terminal 234A.

The ground terminal 235A is provided on the second main surface 2312A of the piezoelectric substrate 231A. The ground terminal 235A is connected to the through-electrode 233A. The ground terminal 235A is formed of an appropriate metal material, such as copper, nickel, or an alloy containing any of these metals as a main component, for example.

Here, in the first radio frequency component 23A disposed on the second main surface 82 of the mounting substrate 8, the space S1 surrounded by the piezoelectric substrate 231A and the plurality of signal terminals 234A is filled with nitrogen or air, for example. Further, in the second radio frequency component 24 disposed on the first main surface 81 of the mounting substrate 8, the space S2 surrounded by the piezoelectric substrate 241 and the plurality of signal terminals 243 is filled with nitrogen or air, for example.

In the radio frequency module 1A according to Modification 2, as described above, the signal terminals 234A are provided on the third main surface 2301A of the first radio frequency component (radio frequency component) 23A, and the ground terminal 235A is provided on the fourth main surface 2302A of the first radio frequency component 23A. That is, in the radio frequency module 1A according to Modification 2, the signal terminals 234A and the ground terminal 235A are provided on the different main surfaces of the first radio frequency component 23A. With this, it is possible to reduce the first radio frequency component 23A in size as compared with a case in which the signal terminals 234A and the ground terminal 235A are provided on the same main surface (third main surface 2301A or fourth main surface 2302A).

In the radio frequency module 1A according to Modification 2, the plurality of signal terminals 234A are provided on the third main surface 2301A of the first radio frequency component 23A, and the ground terminal 235A is provided on the fourth main surface 2302A of the first radio frequency component 23A. Whereas, the ground terminal 235A may be provided on the third main surface 2301A of the first radio frequency component 23A, and the plurality of signal terminals 234A may be provided on the fourth main surface 2302A of the first radio frequency component 23A. Further, in the radio frequency module 1A according to Modification 2, all of the plurality of signal terminals 234A are provided on the third main surface 2301A of the first radio frequency component 23A. However, it is sufficient that at least one of the plurality of signal terminals 234A is provided on the third main surface 2301A. That is, the plurality of signal terminals 234A may include the signal terminal 234A provided on the third main surface 2301A and the signal terminal 234A provided on the fourth main surface 2302A.

(6.3) Modification 3

A radio frequency module 1B according to Modification 3 will be described with reference to FIG. 5. The radio frequency module 1B according to Modification 3 is different from the radio frequency module 1 according to Embodiment 1 in that a first radio frequency component 23B provided on the second main surface 82 of the mounting substrate 8 is a switch IC 26. Other configurations are the same as those of the radio frequency module 1 according to Embodiment 1, and the same constituents are denoted with the same reference signs and the description thereof is omitted.

Figure 5:
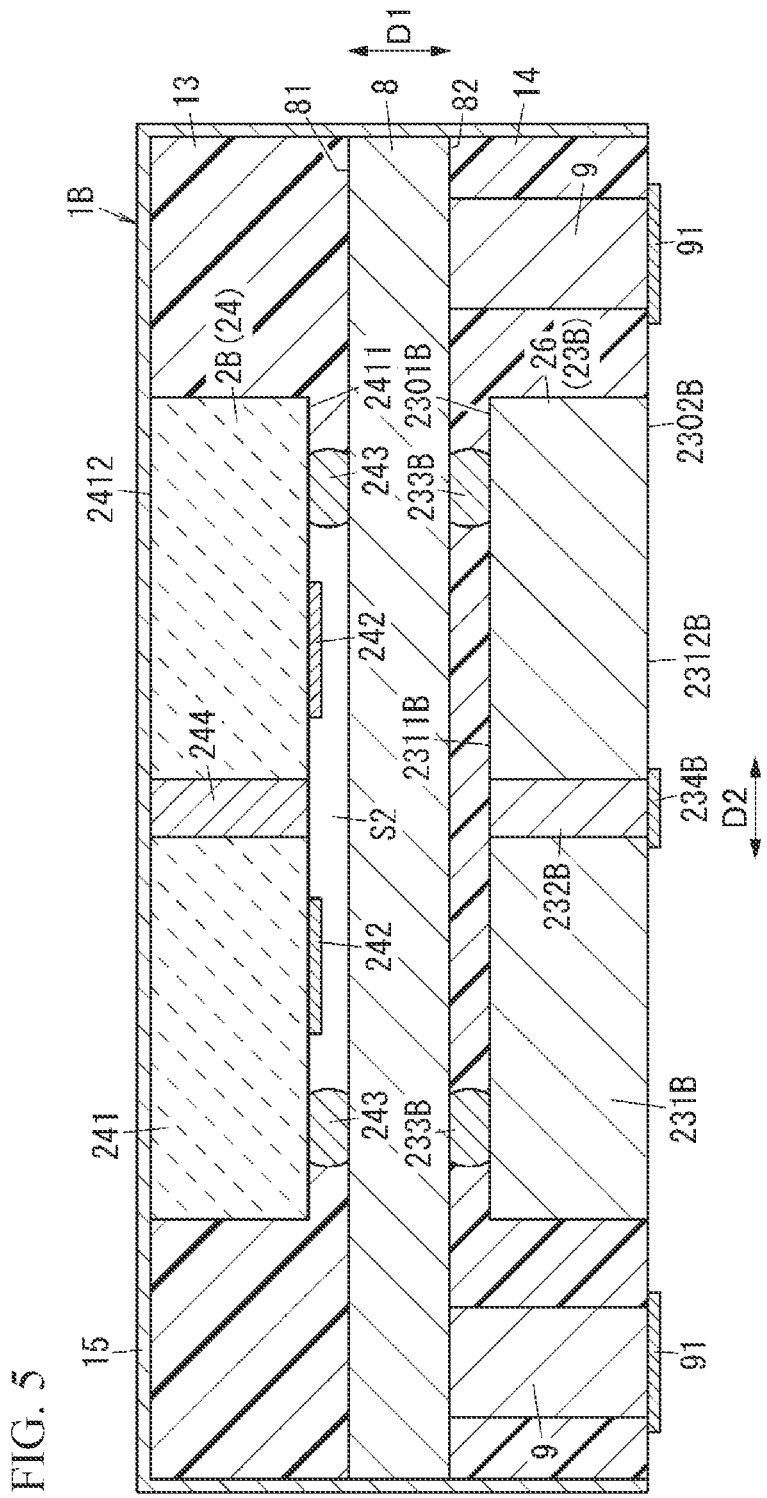
FIG. 5 is a sectional view of a radio frequency module according to Modification 3 of Embodiment 1.

As illustrated in FIG. 5, the radio frequency module 1B according to Modification 3 includes the mounting substrate 8, the first radio frequency component 23B, the second radio frequency component 24, the plurality of (two in the illustrated example) external connection electrodes 9, the first resin layer 13, the second resin layer 14, and the conductive shield layer 15.

As illustrated in FIG. 5, the first radio frequency component 23B is the one-chip switch IC 26 including a substrate 231B and an IC portion (not illustrated) including a field effect transistor (FET) formed on the side of a first main surface 2311B of the substrate 231B, for example. The switch IC 26 includes the first switch 3, the second switch 4, the third switch 5, and the low-noise amplifiers 21A to 21C. The substrate 231B is a silicon substrate, for example. The IC portion is a functional portion having a first function and a second function. The first function is a function of amplifying a reception signal. The second function is a function of switching connection states.

The first radio frequency component 23B further has a through-electrode 232B, a plurality of (two in the illustrated example) signal terminals 233B, and a ground terminal 234B.

The through-electrode 232B penetrates through the substrate 231B in the first direction D1, which is the thickness direction of the substrate 231B. The through-electrode 232B has a cylindrical shape, for example. The through-electrode 232B has a first end portion and a second end portion which are two end portions in the first direction D1. The first end portion (upper end portion in FIG. 5) of the through-electrode 232B is connected to the ground of the low-noise amplifiers 21A to 21C, for example. The second end portion (lower end portion in FIG. 5) of the through-electrode 232B is connected to the ground terminal 234B. The through-electrode 232B is formed of an appropriate metal material, such as copper, nickel, or an alloy containing any of these metals as a main component, for example.

The plurality of signal terminals 233B is disposed on the first main surface 2311B of the substrate 231B. Each of the plurality of signal terminals 233B is a solder bump, for example. Each of the plurality of signal terminals 233B is not limited to a solder bump and may be a gold bump, for example. One (left side in FIG. 4, for example) of the plurality of signal terminals 233B is connected to the input terminal of the low-noise amplifier 21A, for example. Further, the other (right side in FIG. 4, for example) of the plurality of signal terminals 233B is connected to the output terminal of the low-noise amplifier 21A, for example. In Modification 3, the first radio frequency component 23B has the plurality of signal terminals 233B, but it is sufficient that the first radio frequency component 23B has at least one terminal 233B.

The ground terminal 234B is disposed on a second main surface 2312B of the piezoelectric substrate 231B. The ground terminal 234B is connected to the through-electrode 232B. The ground terminal 234B is formed of an appropriate metal material, such as copper, nickel, or an alloy containing any of these metals as a main component, for example.

In Modification 3, the first main surface 2311B of the substrate 231B on which the plurality of signal terminals 233B is disposed corresponds to a third main surface 2301B of the first radio frequency component 23B, and the second main surface 2312B of the substrate 231B on which the ground terminal 234B is disposed corresponds to a fourth main surface 2302B of the first radio frequency component 23B. In the radio frequency module 1B according to Modification 3, the third main surface 2301B of the first radio frequency component 23B is positioned between the second main surface 82 of the mounting substrate 8 and the fourth main surface 2302B of the first radio frequency component 23B in the first direction D1, which is the thickness direction of the mounting substrate 8.

Here, in the second radio frequency component 24 disposed on the first main surface 81 of the mounting substrate 8, the space S2 surrounded by the piezoelectric substrate 241 and the plurality of signal terminals 243 is filled with nitrogen or air, for example.

In the radio frequency module 1B according to Modification 3, as described above, the signal terminals 233B are provided on the third main surface 2301B of the first radio frequency component 23B, and the ground terminal 234B is provided on the fourth main surface 2302B of the first radio frequency component 23B. That is, in the radio frequency module 1B according to Modification 3, the signal terminals 233B and the ground terminal 234B are provided on the different main surfaces of the first radio frequency component 23B. With this, it is possible to reduce the first radio frequency component 23B in size as compared with a case in which the signal terminals 233B and the ground terminal 234B are provided on the same main surface (third main surface 2301B or fourth main surface 2302B).

In the radio frequency module 1B according to Modification 3, the plurality of signal terminals 233B is provided on the third main surface 2301B of the first radio frequency component 23B, and the ground terminal 234B is provided on the fourth main surface 2302B of the first radio frequency component 23B. Whereas, the ground terminal 234B may be provided on the third main surface 2301B of the first radio frequency component 23B, and the plurality of signal terminals 233B may be provided on the fourth main surface 2302B of the first radio frequency component 23B. Further, in the radio frequency module 1B according to Modification 3, all of the plurality of signal terminals 233B are provided on the third main surface 2301B of the first radio frequency component 23B. However, it is sufficient that at least one of the plurality of signal terminals 233B is provided on the third main surface 2301B. That is, the plurality of signal terminals 233B may include the signal terminal 233B provided on the third main surface 2301B and the signal terminal 233B provided on the fourth main surface 2302B.

(6.4) Modification 4

A radio frequency module according to Modification 4 will be described with reference to FIG. 6A. In the radio frequency module according to Modification 4, the structure of a first radio frequency component 23C constituting the duplexer 2A is different from that of the first radio frequency component 23 of the radio frequency module 1 according to Embodiment 1. Other configurations are the same as those of the radio frequency module 1 according to Embodiment 1, and the same constituents are denoted with the same reference signs and the description thereof is omitted.

Figure 6A:
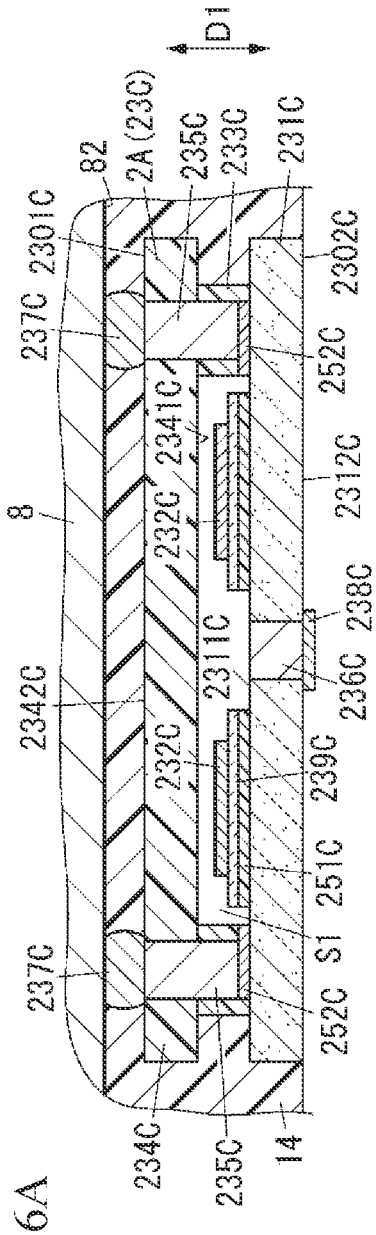
FIG. 6A is a sectional view of an acoustic wave device as a radio frequency component included in a radio frequency module according to Modification 4 of Embodiment 1.

As illustrated in FIG. 6A, the radio frequency module according to Modification 4 includes the mounting substrate 8, the first radio frequency component 23C, the second radio frequency component 24 (see FIG. 1), the plurality of external connection electrodes 9 (see FIG. 1), the first resin layer 13 (see FIG. 1), the second resin layer 14, and the conductive shield layer 15 (see FIG. 1).

The first radio frequency component 23C is an acoustic wave device (hereinafter, also referred to as "acoustic wave device 23C"), for example. As illustrated in FIG. 6A, the acoustic wave device 23C includes a piezoelectric layer 239C, a plurality of (two in the illustrated example) IDT electrodes 232C, a high acoustic velocity support substrate 231C, and a low acoustic velocity film 251C. Further, the acoustic wave device 23C includes a spacer layer 233C, a cover layer 234C, a plurality of (three in the illustrated example) through-electrodes 235C and 236C, a plurality of (two in the illustrated example) signal terminals 237C, a ground terminal 238C, and a plurality of (two in the illustrated example) wiring layers 252C.

The high acoustic velocity support substrate 231C is positioned on the opposite side from the IDT electrode 232C across the piezoelectric layer 239C. In the high acoustic velocity support substrate 231C, the acoustic velocity of a bulk wave propagating through the high acoustic velocity support substrate 231C is higher than the acoustic velocity of an acoustic wave propagating through the piezoelectric layer 239C. The high acoustic velocity support substrate 231C supports the low acoustic velocity film 251C, the piezoelectric layer 239C, and the IDT electrode 232C. The thickness of the high acoustic velocity support substrate 231C is 125 μm, for example. The high acoustic velocity support substrate 231C has a first main surface 2311C and a second main surface 2312C opposed to each other in the first direction D1, which is the thickness direction of the high acoustic velocity support substrate 231C. The second main surface 2312C of the high acoustic velocity support substrate 231C faces an external substrate when the radio frequency module is provided on the external substrate.

The high acoustic velocity support substrate 231C functions to confine an acoustic wave in a portion where the piezoelectric layer 239C and the low acoustic velocity film 251C are laminated, and to prevent the acoustic wave from leaking downward relative to the high acoustic velocity support substrate 231C.

The material of the high acoustic velocity support substrate 231C is silicon, for example. Note that, the material of the high acoustic velocity support substrate 231C is not limited to silicon. The material of the high acoustic velocity support substrate 231C is at least one material selected from the group consisting of silicon carbide, aluminum nitride, aluminum oxide, silicon carbide, silicon nitride, silicon, sapphire, a piezoelectric body (such as lithium tantalate, lithium niobate, or quartz crystal), alumina, zirconia, cordierite, mullite, steatite, forsterite, magnesia, and diamond, for example. The material of the high acoustic velocity support substrate 231C may be a material containing any of the above-described materials as a main component, or a material containing a mixture, which includes any of the above-described materials, as a main component.

The low acoustic velocity film 251C is a film in which the acoustic velocity of a bulk wave propagating therethrough is lower than the acoustic velocity of a bulk wave propagating through the piezoelectric layer 239C. The low acoustic velocity film 251C is provided between the high acoustic velocity support substrate 231C and the piezoelectric layer 239C. Since the low acoustic velocity film 251C is provided between the high acoustic velocity support substrate 231C and the piezoelectric layer 239C, the acoustic velocity of an acoustic wave decreases. An acoustic wave inherently has the property that the energy thereof is concentrated in a medium having a low acoustic velocity. Accordingly, it is possible to increase the effect of confining the energy of an acoustic wave in the piezoelectric layer 239C and the IDT electrode 232C in which an acoustic wave is excited. As a result, the loss may be reduced and the Q factor may be increased as compared with a case in which the low acoustic velocity film 251C is not provided.

The material of the low acoustic velocity film 251C is silicon oxide, for example. Note that, the material of the low acoustic velocity film 251C is not limited to silicon oxide. The material of the low acoustic velocity film 251C may be silicon oxide, glass, silicon oxynitride, tantalum oxide, a compound obtained by adding fluorine, carbon, or boron to silicon oxide, or a material containing any of the materials above as a main component, for example.

The thickness of the low acoustic velocity film 251C can be 2.0λ or less, when the wavelength of an acoustic wave determined by the electrode finger period of the IDT electrode 232C is denoted as λ. The thickness of the low acoustic velocity film 251C is 670 nm, for example. By setting the thickness of the low acoustic velocity film 251C to be 2.0λ or less, film stress may be reduced. As a result, it is possible to reduce warpage of a wafer, which is the source of the high acoustic velocity support substrate 231C, when the acoustic wave device 23C is manufactured, and it becomes possible to improve a non-defective rate and stabilize characteristics. When the thickness of the low acoustic velocity film 251C is in the range of 0.1λ or more and 0.5λ or less, electromechanical coupling coefficient hardly changes regardless of the material of the high acoustic velocity support substrate 231C.

The piezoelectric layer 239C is provided directly or indirectly on the low acoustic velocity film 251C.

The piezoelectric layer 239C is formed of Γ° Y-cut X-propagation $LiTaO_3$ piezoelectric single crystal, for example. An axis is rotated from a Y-axis to a Z-axis with an X-axis as a center axis when the three crystal axes of a $LiTaO_3$ piezoelectric single crystal is defined as the X-axis, the Y-axis, and the Z-axis. The Γ° Y-cut X-propagation $LiTaO_3$ piezoelectric single crystal is obtained by cutting a $LiTaO_3$ piezoelectric single crystal along the plane of which the normal line is the axis above and is a single crystal on which a surface acoustic wave propagates in the X-axis direction. When a cut-angle of the piezoelectric layer 239C is Γ [°] and Euler angles of the piezoelectric layer are (φ, θ, ψ), Γ=θ+90° is satisfied. Note that, Γ and Γ±180×n are synonymous (crystallographically equivalent). Here, n is a natural number. The piezoelectric layer 239C is not limited to the Γ° Y-cut X-propagation $LiTaO_3$ piezoelectric single crystal and may be a Γ° Y-cut X-propagation $LiTaO_3$ piezoelectric ceramics, for example.

The thickness of the piezoelectric layer 239C is 3.5λ or less, when the wavelength of an acoustic wave determined by the electrode finger period of the IDT electrode 232C is denoted as λ, for example. When the thickness of the piezoelectric layer 239C is 3.5λ or less, the Q factor becomes high. Further, by making the thickness of the piezoelectric layer 239C be 2.5λ or less, the temperature coefficient of frequency (TCF) may be reduced. Furthermore, by making the thickness of the piezoelectric layer 239C be 1.5λ or less, it becomes easy to adjust the acoustic velocity of an acoustic wave. The thickness of the piezoelectric layer 239C is not limited to 3.5λ or less and may be greater than 3.5λ.

The material of the piezoelectric layer 239C is not limited to lithium tantalate and may be lithium niobate, zinc oxide, aluminum nitride, or PZT, for example. When the piezoelectric layer 239C is made of a Y-cut X-propagation $LiNbO_3$ piezoelectric single crystal or piezoelectric ceramics, for example, the acoustic wave device 23C may use a mode, in which an SH wave is a main component, as a main mode by using a Love wave as an acoustic wave. Note that, the single crystal material and the cut-angle of the piezoelectric layer 239C may appropriately be determined according to, for example, required specifications of a filter (filter characteristic, such as bandpass characteristic, attenuation characteristic, temperature characteristic, and bandwidth).

Each of the plurality of IDT electrodes 232C has a first busbar, a second busbar, a plurality of first electrode fingers, and a plurality of second electrode fingers. The second busbar faces the first busbar.

The plurality of first electrode fingers is connected to the first busbar and extends toward the side of the second busbar. The plurality of first electrode fingers is integrally formed with the first busbar and is separated from the second busbar.

The plurality of second electrode fingers is connected to the second busbar and extends toward the side of the first busbar. The plurality of second electrode fingers is integrally formed with the second busbar and is separated from the first busbar.

In each IDT electrode 232C, the plurality of first electrode fingers and the plurality of second electrode fingers are alternately arranged one by one being separated from each other. Accordingly, the first electrode finger and the second electrode finger adjacent to each other are separated. The first busbar is a conductor portion for making the plurality of first electrode fingers have the same electric potential. The second busbar is a conductor portion for making the plurality of second electrode fingers have the same electric potential.

The electrode finger period (electrode finger pitch) of the IDT electrode 232C is defined as the distance between the center lines of the adjacent two first electrode fingers of the plurality of first electrode fingers or the distance between the center lines of the adjacent two second electrode fingers of the plurality of second electrode fingers. The distance between the center lines of the adjacent two second electrode fingers is the same as the distance between the center lines of the adjacent two first electrode fingers.

The material of each IDT electrode 232C is an appropriate metal material, such as aluminum, copper, platinum, gold, silver, titanium, nickel, chromium, molybdenum, tungsten, or an alloy containing any of these metals as a main component, for example. Further, each IDT electrode 232C may have a structure in which a plurality of metal films made of these metals or alloys is laminated.

Here, the spacer layer 233C, the cover layer 234C, the through-electrodes 235C and 236C, the plurality of signal terminals 237C, and the ground terminal 238C are similar to the spacer layer 233, the cover layer 234, the through-electrodes 235 and 236, the plurality of signal terminals 237, and the ground terminal 238 described in Embodiment 1 above, and the description thereof is omitted.

The plurality of IDT electrodes 232C and the plurality of wiring layers 252C correspond to each other on a one-to-one basis. Each of the plurality of IDT electrodes 232C is connected to corresponding one of the plurality of through-electrodes 235C via corresponding one of the plurality of wiring layers 252C.

In Modification 4, a second main surface 2342C of the cover layer 234C on which the plurality of signal terminals 237C is disposed corresponds to a third main surface 2301C of the first radio frequency component 23C, and the second main surface 2312C of the high acoustic velocity support substrate 231C on which the ground terminal 238C is disposed corresponds to a fourth main surface 2302C of the first radio frequency component 23C. In a radio frequency module 1C according to Modification 4, the third main surface 2301C of the first radio frequency component 23C is positioned between the second main surface 82 of the mounting substrate 8 and the fourth main surface 2302C of the first radio frequency component 23C in the first direction D1, which is the thickness direction of the mounting substrate 8. Further, in the radio frequency module 1C according to Modification 4, the piezoelectric layer 239C is positioned between the mounting substrate 8 and the high acoustic velocity support substrate 231C in the first direction D1, which is the thickness direction of the mounting substrate 8.

Here, in the first radio frequency component 23C disposed on the second main surface 82 of the mounting substrate 8, the space S1 surrounded by the high acoustic velocity support substrate 231C, the spacer layer 233C, and the cover layer 234C is filled with nitrogen or air, for example. Further, in the second radio frequency component 24 disposed on the first main surface 81 of the mounting substrate 8, the space S2 surrounded by the piezoelectric substrate 241 and the plurality of signal terminals 243 is filled with nitrogen or air, for example.

In the radio frequency module according to Modification 4, as described above, the signal terminal 237C is provided on the third main surface 2301C of the first radio frequency component 23C, and the ground terminal 238C is provided on the fourth main surface 2302C of the first radio frequency component 23C. That is, in the radio frequency module according to Modification 4, the signal terminals 237C and the ground terminal 238C are provided on the different main surfaces of the first radio frequency component 23C. With this, it is possible to reduce the first radio frequency component 23C in size as compared with a case in which the signal terminals 237C and the ground terminal 238C are provided on the same main surface (third main surface 2301C or fourth main surface 2302C).

In the radio frequency module according to Modification 4, the plurality of signal terminals 237C is provided on the third main surface 2301C of the first radio frequency component 23C, and the ground terminal 238C is provided on the fourth main surface 2302C of the first radio frequency component 23C. Whereas, the ground terminal 238C may be provided on the third main surface 2301C of the first radio frequency component 23C, and the plurality of signal terminals 237C may be provided on the fourth main surface 2302C of the first radio frequency component 23C. Further, in the radio frequency module according to Modification 4, all of the plurality of signal terminals 237C are provided on the third main surface 2301C of the first radio frequency component 23C. However, it is sufficient that at least one of the plurality of signal terminals 237C is provided on the third main surface 2301C. That is, the plurality of signal terminals 237C may include the signal terminal 237C provided on the third main surface 2301C and the signal terminal 237C provided on the fourth main surface 2302C.

Here, the "signal terminal" in Modification 4 may include not only the signal terminal 237C but also the through-electrode 235C or may include the through-electrode 235C and the wiring layer 252C.

(6.5) Modification 5

A radio frequency module according to Modification 5 will be described with reference to FIG. 6B. In the radio frequency module according to Modification 5, the structure of a first radio frequency component 23D constituting the duplexer 2A is different from that of the first radio frequency component 23C of the radio frequency module according to Modification 4. Other configurations are the same as those of the radio frequency module according to Modification 4, and the same constituents are denoted with the same reference signs and the description thereof is omitted.

Figure 6B:
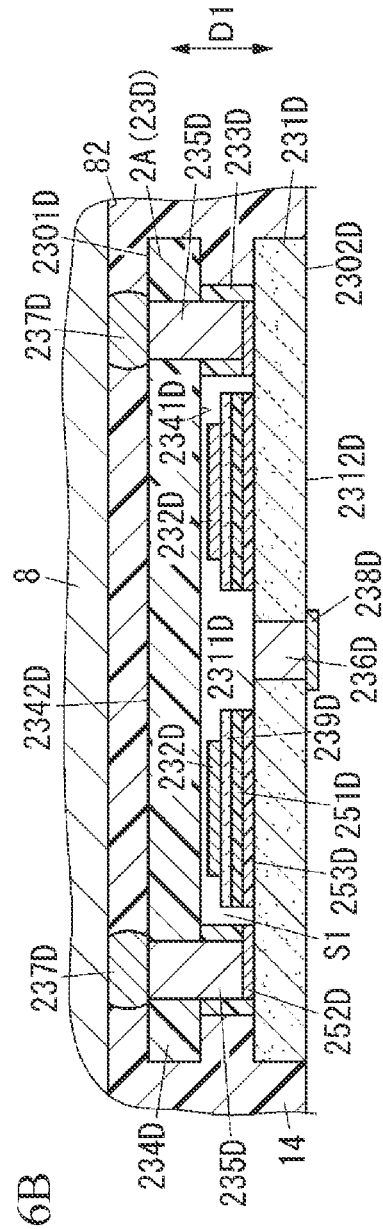
FIG. 6B is a sectional view of an acoustic wave device as a radio frequency component included in a radio frequency module according to Modification 5 of Embodiment 1.

As illustrated in FIG. 6B, the radio frequency module according to Modification 5 includes the mounting substrate 8, the first radio frequency component 23D, the second radio frequency component 24 (see FIG. 1), the plurality of external connection electrodes 9 (see FIG. 1), the first resin layer 13 (see FIG. 1), the second resin layer 14, and the conductive shield layer 15 (see FIG. 1).

The first radio frequency component 23D is an acoustic wave device (hereinafter, also referred to as "acoustic wave device 23D"), for example. As illustrated in FIG. 6B, the acoustic wave device 23D includes a piezoelectric layer 239D, a plurality of (two in the illustrated example) IDT electrodes 232D, a support substrate 231D, a low acoustic velocity film 251D, and a high acoustic velocity film 253D. Further, the acoustic wave device 23D includes a spacer layer 233D, a cover layer 234D, a plurality of (three in the illustrated example) through-electrodes 235D and 236D, a plurality of (two in the illustrated example) signal terminals 237D, a ground terminal 238D, and a plurality of (two in the illustrated example) wiring layers 252D.

The support substrate 231D is positioned on the opposite side from the IDT electrode 232D across the piezoelectric layer 239D. The support substrate 231D supports the high acoustic velocity film 253D, the low acoustic velocity film 251D, the piezoelectric layer 239D, and the IDT electrode 232D. The support substrate 231D has a first main surface 2311D and a second main surface 2312D opposed to each other in the first direction D1, which is the thickness direction of the support substrate 231D. The second main surface 2112D of the support substrate 231D faces an external substrate when the radio frequency module is provided on the external substrate.

The material of the support substrate 231D is silicon, for example. Note that, the material of the support substrate 231D is not limited to silicon. The material of the support substrate 231D is, for example, at least one material selected from the group consisting of: silicon; sapphire; piezoelectric bodies (such as lithium tantalate, lithium niobate, or quartz crystal); various ceramics, such as alumina, magnesia, silicon nitride, aluminum nitride, silicon carbide, zirconia, cordierite, mullite, steatite, forsterite; dielectric such as glass; a semiconductor such as gallium nitride; and resin. The material of the support substrate 231D may be a material containing any of the above-described materials as a main component or a material containing a mixture, which includes any of the above-described materials, as a main component.

The high acoustic velocity film 253D is a film in which the acoustic velocity of a bulk wave propagating therethrough is higher than the acoustic velocity of an acoustic wave propagating through the piezoelectric layer 239D. The high acoustic velocity film 253D is formed on the support substrate 231D. Here, "formed on the support substrate 231D" includes a case of being directly formed on the support substrate 231D and a case of being indirectly formed on the support substrate 231D. The low acoustic velocity film 251D is formed on the high acoustic velocity film 253D. Here, "formed on the high acoustic velocity film 253D" includes a case of being directly formed on the high acoustic velocity film 253D and a case of being indirectly formed on the high acoustic velocity film 253D. In the low acoustic velocity film 251D, the acoustic velocity of a bulk wave propagating through the low acoustic velocity film 251D is lower than the acoustic velocity of a bulk wave propagating through the piezoelectric layer 239D. The piezoelectric layer 239D is formed on the low acoustic velocity film 251D. Here, "formed on the low acoustic velocity film 251D" includes a case of being directly formed on the low acoustic velocity film 251D and a case of being indirectly formed on the low acoustic velocity film 251D.

The high acoustic velocity film 253D functions to prevent the energy of the acoustic wave in the main mode from leaking to the structure below the high acoustic velocity film 253D.

The material of the high acoustic velocity film 253D is at least one material selected from the group consisting of diamond-like carbon, aluminum nitride, aluminum oxide, silicon carbide, silicon nitride, silicon, sapphire, a piezoelectric body (lithium tantalate, lithium niobate, or quartz crystal), alumina, zirconia, cordierite, mullite, steatite, forsterite, magnesia, and diamond, for example. The material of the high acoustic velocity film 253D may be a material containing any of the above-described materials as a main component or a material containing a mixture, which includes any of the above-described materials, as a main component.

In Modification 5, a second main surface 2342D of the cover layer 234D on which the plurality of signal terminals 237D is disposed corresponds to a third main surface 2301D of the first radio frequency component 23D, and the second main surface 2312D of the support substrate 231D on which the ground terminal 238D is disposed corresponds to a fourth main surface 2302D of the first radio frequency component 23D. In a radio frequency module 1D according to Modification 5, the third main surface 2301D of the first radio frequency component 23D is positioned between the second main surface 82 of the mounting substrate 8 and the fourth main surface 2302D of the first radio frequency component 23D in the first direction D1, which is the thickness direction of the mounting substrate 8. Further, in the radio frequency module 1D according to Modification 5, the piezoelectric layer 239D is positioned between the mounting substrate 8 and the support substrate 231D in the first direction D1, which is the thickness direction of the mounting substrate 8.

Here, in the first radio frequency component 23D disposed on the second main surface 82 of the mounting substrate 8, the space S1 surrounded by the support substrate 231D, the spacer layer 233D, and the cover layer 234D is filled with nitrogen or air, for example. In the second radio frequency component 24 disposed on the first main surface 81 of the mounting substrate 8, the space S2 surrounded by the piezoelectric substrate 241 and the plurality of signal terminals 243 is filled with nitrogen or air, for example.

In the radio frequency module according to Modification 5, as illustrated in FIG. 6B, the signal terminals 237D are provided on the third main surface 2301D of the first radio frequency component 23D, and the ground terminal 238D is provided on the fourth main surface 2302D of the first radio frequency component 23D. That is, in the radio frequency module according to Modification 5, the signal terminals 237D and the ground terminal 238D are provided on the different main surfaces of the first radio frequency component 23D. With this, it is possible to reduce the first radio frequency component 23D in size as compared with a case in which the signal terminals 237D and the ground terminal 238D are provided on the same main surface (third main surface 2301D or third main surface 2301D).

In the radio frequency module according to Modification 5, the plurality of signal terminals 237D is provided on the third main surface 2301D of the first radio frequency component 23D, and the ground terminal 238D is provided on the fourth main surface 2302D of the first radio frequency component 23D. Whereas, the ground terminal 238D may be provided on the third main surface 2301D of the first radio frequency component 23D, and the plurality of signal terminals 237D may be provided on the fourth main surface 2302D of the first radio frequency component 23D. Further, in the radio frequency module according to Modification 5, all of the plurality of signal terminals 237D are provided on the third main surface 2301D of the first radio frequency component 23D. However, it is sufficient that at least one of the plurality of signal terminals 237D is provided on the third main surface 2301D. That is, the plurality of signal terminals 237D may include the signal terminal 237D provided on the third main surface 2301D and the signal terminal 237D provided on the fourth main surface 2302D.

Here, the "signal terminal" in Modification 5 may include not only the signal terminal 237D but also the through-electrode 235D or may include the through-electrode 235D and the wiring layer 252D.

Embodiment 2

A radio frequency module 1E according to Embodiment 2 will be described with reference to FIG. 7A and FIG. 7B. The radio frequency module 1E according to Embodiment 2 is different from the radio frequency module 1B according to Modification 2 of Embodiment 1 in that an inductor 27, which is provided between the antenna terminal 100 and the common terminal 30 of the first switch 3, is provided on the side of the second main surface 82 of the mounting substrate 8. Other configurations are the same as those of the radio frequency module 1B according to Modification 2 of Embodiment 1, and the same constituents are denoted with the same reference signs and the description thereof is omitted.

Figure 7A:
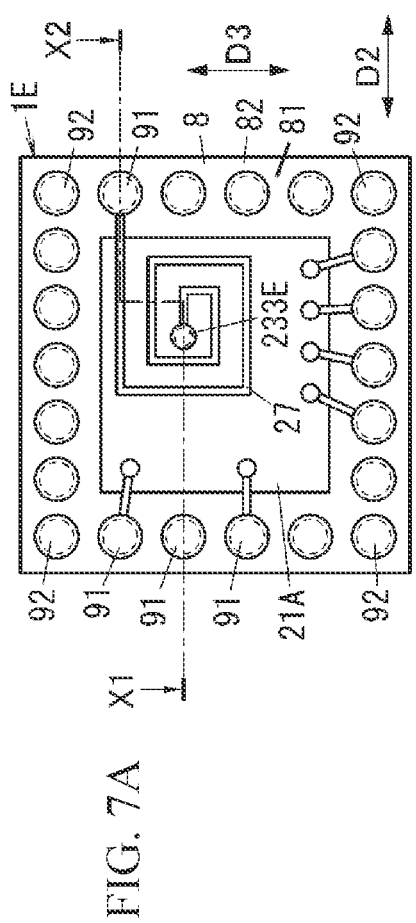
FIG. 7A is a bottom view of a radio frequency module according to Embodiment 2.
Figure 7B:
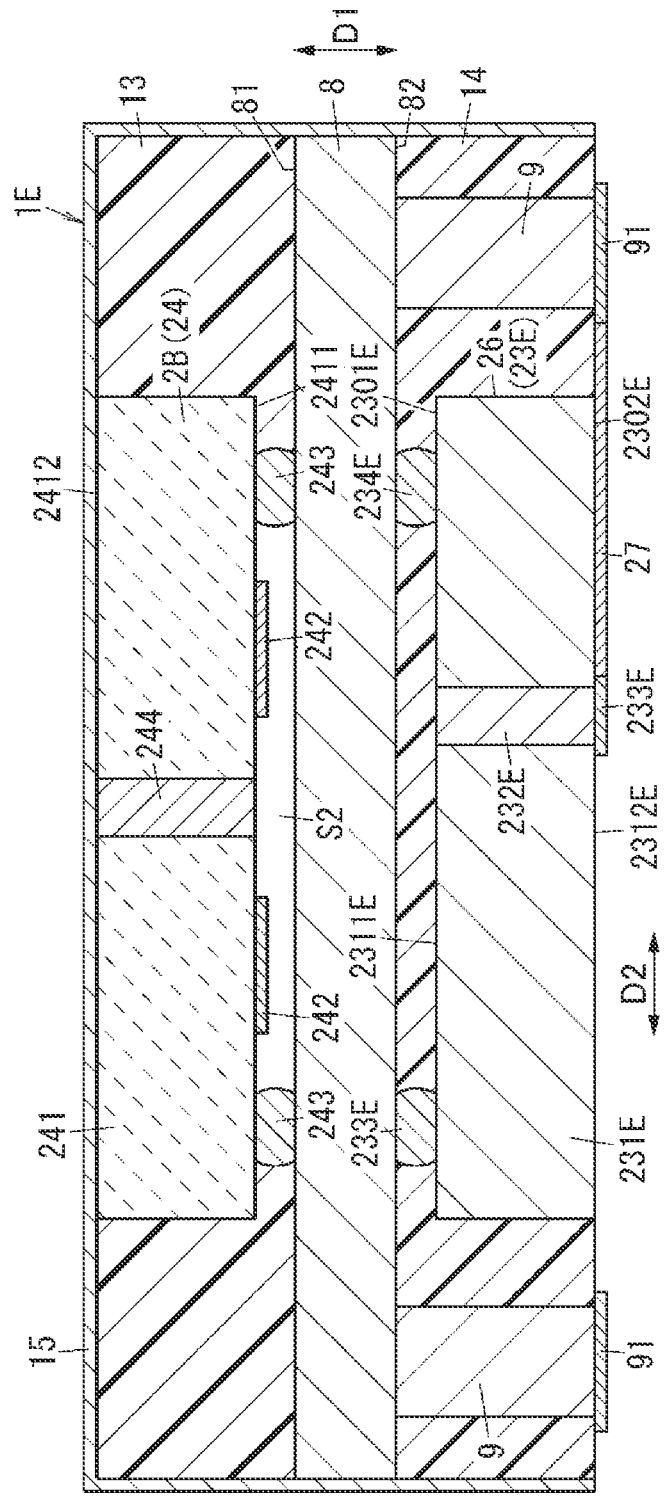
FIG. 7B is a sectional view of FIG. 7A in a plane X1-X2.

As illustrated in FIG. 7A and FIG. 7B, the radio frequency module 1E according to Embodiment 2 includes the mounting substrate 8, a first radio frequency component 23E, and the second radio frequency component 24. Further, the radio frequency module 1E includes the plurality of (two in the illustrated example) external connection electrodes 9, the first resin layer 13, the second resin layer 14, and the conductive shield layer 15. Furthermore, the radio frequency module 1E includes the inductor 27.

As illustrated in FIG. 7B, the first radio frequency component 23E is the one-chip switch IC 26 including a substrate 231E and an IC portion (not illustrated) including an FET formed on the side of a first main surface 2311E of the substrate 231E, for example. The switch IC 26 includes the first switch 3, the second switch 4, the third switch 5, and the low-noise amplifiers 21A to 21C, for example. The substrate 231E is a silicon substrate, for example. The IC portion is a functional portion having a first function and a second function. The first function is a function of amplifying a reception signal. The second function is a function of switching connection states.

The first radio frequency component 23E further has a through-electrode 232E, a plurality of (two in the illustrated example) signal terminals 233E, and a ground terminal 234E.

The through-electrode 232E penetrates through the substrate 231E in the first direction D1, which is the thickness direction of the substrate 231E. The through-electrode 232E has a cylindrical shape, for example. The through-electrode 232E has a first end portion and a second end portion which are two end portions in the first direction D1, which is the thickness direction of the substrate 231E. The first end portion (upper end portion in FIG. 7B) of the through-electrode 232E is connected to the common terminal 30 of the first switch 3, for example. The second end portion (lower end portion in FIG. 7B) of the through-electrode 232E is connected to, of the plurality of signal terminals 233E, the signal terminal 233E disposed on a second main surface 2312E of the substrate 231E. The through-electrode 232E is formed of an appropriate metal material, such as copper, nickel, or an alloy containing any of these metals as a main component, for example.

One (left side in FIG. 7B) of the plurality of signal terminals 233E is disposed on the first main surface 2311E of the substrate 231E. The signal terminal 233E is a solder bump but may be a gold bump, for example. The signal terminal 233E is connected to the selection terminal 31 of the first switch 3, for example.

Further, the other (right side in FIG. 7B) the plurality of signal terminals 233E is disposed on the second main surface 2312E of the substrate 231E. The signal terminal 233E is connected to the through-electrode 232E. The signal terminal 233E is made of an appropriate metal material, such as copper, nickel, or an alloy containing any of these metals as a main component, for example. In Embodiment 2, the first radio frequency component 23E has the plurality of signal terminals 233E, but it is sufficient that the first radio frequency component 23E has at least one signal terminal 233E.

The ground terminal 234E is disposed on the first main surface 2311E of the substrate 231E. The ground terminal 234E is a solder bump but may be a gold bump, for example. The signal terminal 233E is connected to the ground of the low-noise amplifiers 21A to 21C, for example.

The inductor 27 is provided between the antenna terminal 100 and the common terminal 30 of the first switch 3, and performs impedance matching between the antenna 7 connected to the antenna terminal 100 and the duplexers 2A to 2C, for example. The inductor 27 is a rectangular spiral conductor pattern as illustrated in FIG. 7A. The inductor 27 has a first end portion and a second end portion. The first end portion of the inductor 27 is connected to, of the plurality of signal terminals 233E, the signal terminal 233E disposed on the second main surface 2312E of the substrate 231E. The second end portion of the inductor 27 is connected to one external connection terminal 91 of the plurality of external connection terminals 91. The external connection terminal 91 is connected to the antenna terminal 100, for example.

Here, the plurality of external connection terminals 91 and a plurality of external connection terminals 92 are provided on the side of the second main surface 82 of the mounting substrate 8. The plurality of external connection terminals 91 is an input terminal and an output terminal, for example. The plurality of external connection terminals 92 is a ground terminal, for example.

In the radio frequency module 1E according to Embodiment 2, as illustrated in FIG. 7B, one of the plurality of signal terminals 233E and the ground terminal 234E are disposed on the first main surface 2311E of the substrate 231E. Further, in the radio frequency module 1E, the other of the plurality of signal terminals 233E is disposed on the second main surface 2312E of the substrate 231E. As described above, it is possible to reduce the first radio frequency component 23E in size by separately arranging the plurality of signal terminals 233E and the ground terminal 234E on the first main surface 2311E and the second main surface 2312E of the substrate 231E.

Further, in the radio frequency module 1E, the conductor pattern forming the inductor 27 is provided on the side of the second main surface 2312E of the substrate 231E, that is, at a position apart from the mounting substrate 8. Thus, the isolation between the plurality of external connection terminals 91 may be ensured.

In the radio frequency module 1E according to Embodiment 2, one of the plurality of signal terminals 233E and the ground terminal 234E are provided on the first main surface 2311E of the substrate 231E, and the other of the plurality of signal terminals 233E is provided on the second main surface 2312E of the substrate 231E. Thus, the configuration is not limited to that described above, as long as the plurality of signal terminals 233E and the ground terminal 234E separately arranged on the first main surface 2311E and the second main surface 2312E. For example, the plurality of signal terminals 233E may be provided on the first main surface 2311E, and the ground terminal 234E may be provided on the second main surface 2312E.

Embodiment 3

A radio frequency module 1F according to Embodiment 3 will be described with reference to FIG. 8. The radio frequency module 1F according to Embodiment 3 is different from the radio frequency module 1B according to Modification 2 of Embodiment 1 in that the duplexer 2A as a first radio frequency component 23F and an inductor 28 are provided in addition to the switch IC 26 as a first radio frequency component 23G. Other configurations are the same as those of the radio frequency module 1B according to Modification 2 of Embodiment 1, and the same constituents are denoted with the same reference signs and the description thereof is omitted.

Figure 8:
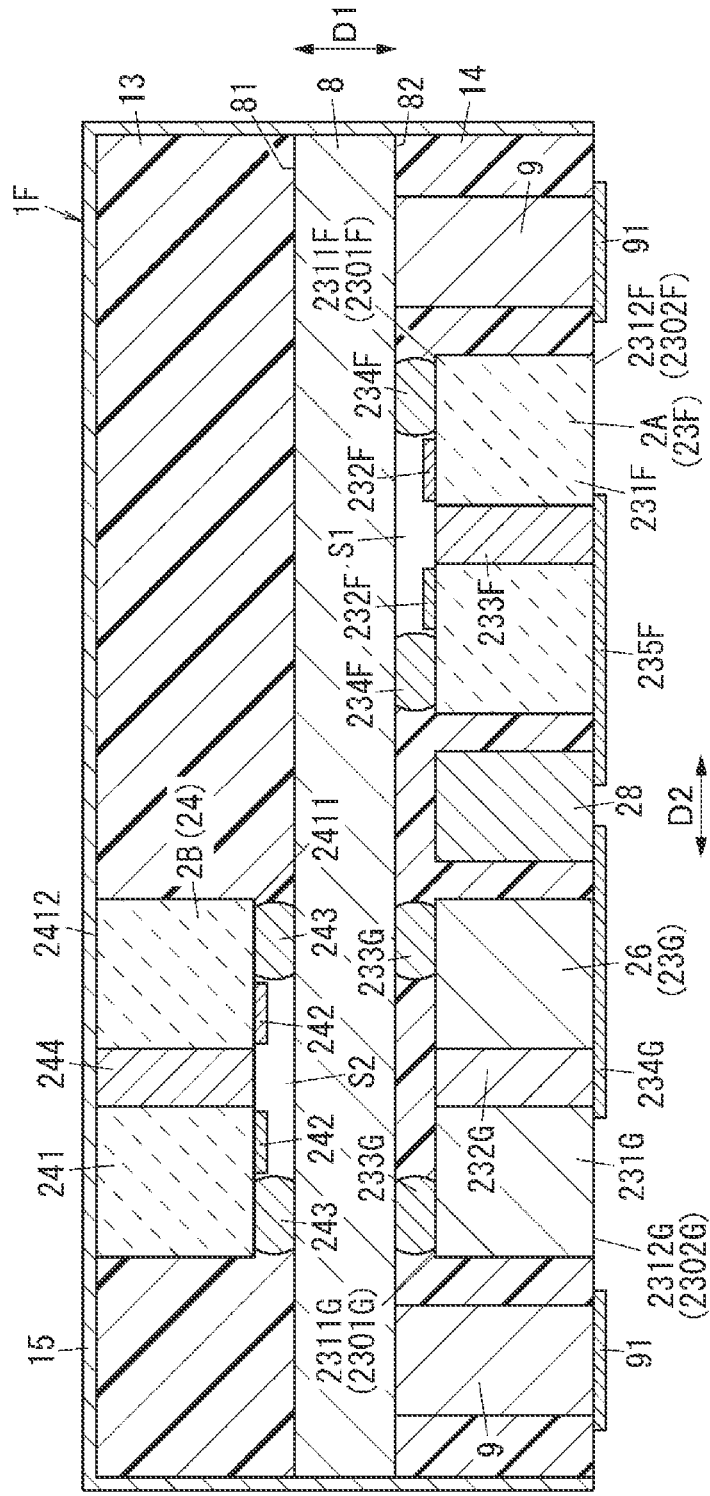
FIG. 8 is a sectional view of a radio frequency module according to Embodiment 3.

As illustrated in FIG. 8, the radio frequency module 1F according to Embodiment 3 includes the mounting substrate 8, the first radio frequency components 23F and 23G, and the second radio frequency component 24. Further, the radio frequency module 1F includes the plurality of (two in the illustrated example) external connection electrodes 9, the first resin layer 13, the second resin layer 14, and the conductive shield layer 15. Furthermore, the radio frequency module 1E includes the inductor 28.

The first radio frequency components 23F and 23G, and the inductor 28 are arranged on the side of the second main surface 82 of the mounting substrate 8 in the order of the first radio frequency component 23F, the inductor 28, and the first radio frequency component 23G from one side (right side in FIG. 8) in a second direction D2 orthogonal to the first direction D1, which is the thickness direction of the mounting substrate 8. That is, the inductor 28 is disposed between the first radio frequency component 23F and the first radio frequency component 23G in the second direction D2.

As illustrated in FIG. 8, the first radio frequency component 23F includes a piezoelectric substrate 231F, a plurality of (two in the illustrated example) IDT electrodes 232F, a through-electrode 233F, a plurality of (two in the illustrated example) signal terminals 234F, and a ground terminal 235F. In the first radio frequency component 23F, the plurality of signal terminals 234F is disposed on a first main surface 2311F of the piezoelectric substrate 231F, and the ground terminal 235F is disposed on a second main surface 2312F of the piezoelectric substrate 231F. Thus, the first radio frequency component 23F may be reduced in size as compared with a case in which the plurality of signal terminals 234F and the ground terminal 235F are disposed on the first main surface 2311F of the piezoelectric substrate 231F, for example. In the present embodiment, the first main surface 2311F of the piezoelectric substrate 231F corresponds to a third main surface 2301F of the first radio frequency component 23F, and the second main surface 2312F of the piezoelectric substrate 231F corresponds to a fourth main surface 2302F of the first radio frequency component 23F. In the radio frequency module 1F according to Embodiment 3, the third main surface 2301F of the first radio frequency component 23F is positioned between the second main surface 82 of the mounting substrate 8 and the fourth main surface 2302F of the first radio frequency component 23F in the first direction D1, which is the thickness direction of the mounting substrate 8.

As illustrated in FIG. 8, the first radio frequency component 23G is the one-chip switch IC 26 including a substrate 231G and an IC portion (not illustrated) including an FET formed on the side of a first main surface 2311G of the substrate 231G, for example. The switch IC 26 includes the first switch 3, the second switch 4, the third switch 5, and the low-noise amplifiers 21A to 21C, for example. The substrate 231G is a silicon substrate, for example. The IC portion is a functional portion having a first function and a second function. The first function is a function of amplifying a reception signal. The second function is a function of switching connection states.

The first radio frequency component 23G further includes a through-electrode 232G, a plurality of (two in the illustrated example) signal terminals 233G, and a ground terminal 234G.

The through-electrode 232G penetrates through the substrate 231G in the first direction D1, which is the thickness direction of the substrate 231G. The through-electrode 232G has a cylindrical shape, for example. The through-electrode 232G has a first end portion and a second end portion which are two end portions in the first direction D1, which is the thickness direction of the substrate 231G. The first end portion (upper end portion in FIG. 8) of the through-electrode 232G is connected to the ground of the low-noise amplifier 21A, for example. The second end portion (lower end portion in FIG. 8) of the through-electrode 232G is connected to the ground terminal 234G. The through-electrode 232G is formed of an appropriate metal material, such as copper, nickel, or an alloy containing any of these metals as a main component, for example.

The plurality of signal terminals 233G is disposed on the first main surface 2311G of the substrate 231G. Each of the plurality of signal terminals 233G is a solder bump, but may be a gold bump, for example. Each of the plurality of signal terminals 2333G is connected to the input terminal and the output terminal of the low-noise amplifier 21A, for example. In Embodiment 3, the first radio frequency component 23G has the plurality of signal terminals 233G, but it is sufficient that the first radio frequency component 23G has at least one signal terminal 233G.

The ground terminal 234G is disposed on a second main surface 2312G of the substrate 231G. The ground terminal 234G is connected to the ground of the inductor 28, for example. The ground terminal 234G is formed of an appropriate metal material, such as copper, nickel, or an alloy containing any of these metals as a main component, for example.

In the first radio frequency component 23G, as described above, the plurality of signal terminals 233G is disposed on the first main surface 2311G of the substrate 231G, and the ground terminal 234G is disposed on the second main surface 2312G of the substrate 231G. Thus, the first radio frequency component 23G may be reduced in size as compared with a case in which the plurality of signal terminals 233G and the ground terminal 234G are disposed on the first main surface 2311G of the substrate 231G, for example. In the present embodiment, the first main surface 2311G of the substrate 231G corresponds to a third main surface 2301G of the first radio frequency component 23G, and the second main surface 2312G of the substrate 231G corresponds to a fourth main surface 2302G of the first radio frequency component 23G. In the radio frequency module 1F according to Embodiment 3, the third main surface 2301G of the first radio frequency component 23G is positioned between the second main surface 82 of the mounting substrate 8 and the fourth main surface 2302G of the first radio frequency component 23G in the first direction D1, which is the thickness direction of the mounting substrate 8.

The inductor 28 is provided between the low-noise amplifier 21A and the first reception filter 22A included in the switch IC 26, and performs impedance matching between the low-noise amplifier 21A and the first reception filter 22A, for example.

In the radio frequency module 1F according to Embodiment 3, the ground terminal 235F of the first radio frequency component 23F is connected to the inductor 28 on the side of the second main surface 2312F of the piezoelectric substrate 231F. Further, in the radio frequency module 1F, the ground terminal 234G of the first radio frequency component 23G is connected to the inductor 28 on the side of the second main surface 2312G of the substrate 231G. As described above, by providing the wiring line that connects the first radio frequency components 23F and 23G and the inductor 28 at a position apart from the mounting substrate 8, the parasitic capacitance of the wiring line may be suppressed. This has an advantage of contributing to the improvement of the characteristics of the radio frequency module 1F.

In the radio frequency module 1F according to Embodiment 3, in the first radio frequency component 23F, the plurality of signal terminals 234F is disposed on the first main surface 2311F of the piezoelectric substrate 231F, and the ground terminal 235F is disposed on the second main surface 2312F of the piezoelectric substrate 231F. Whereas, the ground terminal 235F may be disposed on the first main surface 2311F, and the plurality of signal terminals 234F may be disposed on the second main surface 2312F. Further, it is not necessary that all of the plurality of signal terminals 234F are disposed on the same main surface (first main surface 2311F or second main surface 2312F). For example, one of the plurality of signal terminals 234F may be disposed on the first main surface 2311F, and the other of the plurality of signal terminals 234F and the ground terminal 235F may be disposed on the second main surface 2312F. Note that, the same applies to the first radio frequency component 23G.

Embodiment 4

A radio frequency module 1J according to Embodiment 4 will be described with reference to FIG. 9. The radio frequency module 1J according to Embodiment 4 is different from the radio frequency module 1A according to Modification 1 of Embodiment 1 in that a second radio frequency component 24J is the power amplifier 11A. Further, the radio frequency module 1J according to Embodiment 4 is different from the radio frequency module 1A according to Modification 1 of Embodiment 1 in that a ground terminal 235J of the first transmission filter 12A and a ground terminal 237J of the first reception filter 22A are separately disposed in a first radio frequency component 23J. Here, the first transmission filter 12A and the first reception filter 22A constitute the duplexer 2A. Other configurations are the same as those of the radio frequency module 1A according to Modification 1 of Embodiment 1, and the same constituents are denoted with the same reference signs and the description thereof is omitted.

Figure 9:
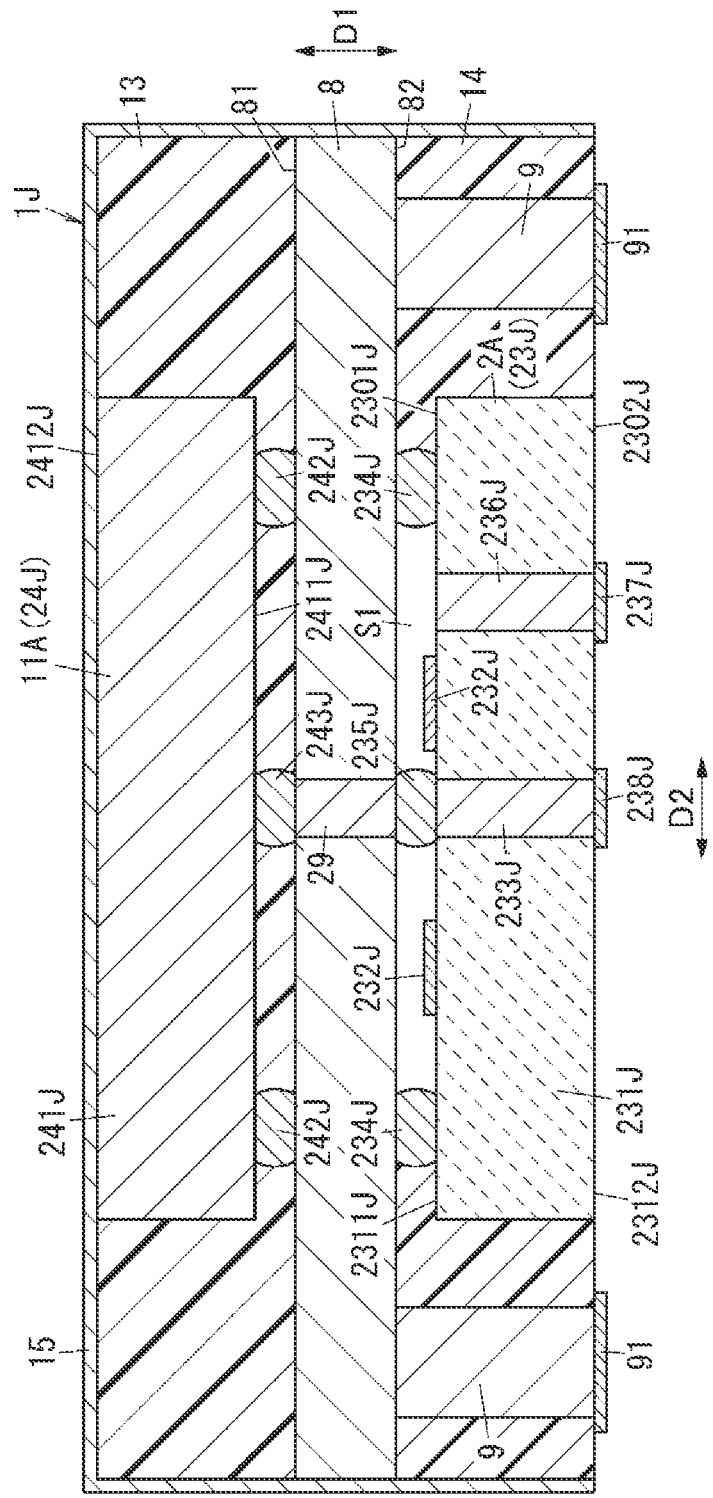
FIG. 9 is a sectional view of a radio frequency module according to Embodiment 4.

As illustrated in FIG. 9, the radio frequency module 1J according to Embodiment 4 includes the mounting substrate 8, the first radio frequency component 23J, and the second radio frequency component 24J. Further, the radio frequency module 1J includes the plurality of (two in the illustrated example) external connection electrodes 9, the first resin layer 13, the second resin layer 14, and the conductive shield layer 15.

The first radio frequency component 23J is the duplexer 2A including the first transmission filter 12A and the first reception filter 22A, for example. As illustrated in FIG. 9, the first radio frequency component 23J includes a piezoelectric substrate 231J, a plurality of (two in the illustrated example) IDT electrodes 232J, a plurality of (two in the illustrated example) through-electrodes 233J and 236J, a plurality of (two in the illustrated example) signal terminals 234J, the plurality of (two in the illustrated example) ground terminals 235J and 237J, and an external connection terminal 238J.

The ground terminal 235J (first ground terminal) is connected to the ground of the first transmission filter 12A. The ground terminal 235J is a solder bump, but may be a gold bump, for example. The ground terminal 235J is disposed on a first main surface 2311J of the piezoelectric substrate 231J. Further, the ground terminal 235J is connected to the external connection terminal 238J disposed on a second main surface 2312J of the piezoelectric substrate 231J via the through-electrode 233J.

The ground terminal 237J (second ground terminal) is connected to the ground of the first reception filter 22A via the through-electrode 236J. The ground terminal 237J is formed of an appropriate metal material, such as copper, nickel, or an alloy containing any of these metals as a main component, for example. The ground terminal 237J is disposed on the second main surface 2312J of the piezoelectric substrate 231J.

In the radio frequency module 1J according to Embodiment 4, the ground terminal 235J connected to the ground of the first transmission filter 12A is disposed on the first main surface 2311J of the piezoelectric substrate 231J, and the ground terminal 237J connected to the ground of the first reception filter 22A is disposed on the second main surface 2312J of the piezoelectric substrate 231J. Thus, isolation between the first transmission filter 12A and the first reception filter 22A may be improved, and as a result, it is possible to suppress deterioration in the filter characteristics of each of the first transmission filter 12A and the first reception filter 22A.

Further, it is possible to reduce the first radio frequency component 23J in size as compared with a case in which the ground terminals 235J and 237J are disposed on the same main surface (first main surface 2311) or second main surface 2312J) of the piezoelectric substrate 231J.

In the present embodiment, the first main surface 2311J of the piezoelectric substrate 231J corresponds to a third main surface 2301J of the first radio frequency component 23J, and the second main surface 2312J of the piezoelectric substrate 231J corresponds to a fourth main surface 2302J of the first radio frequency component 23J. In the radio frequency module 1J according to Embodiment 4, the third main surface 2301J of the first radio frequency component 23J is positioned between the second main surface 82 of the mounting substrate 8 and the fourth main surface 2302J of the first radio frequency component 23J in the first direction D1, which is the thickness direction of the mounting substrate 8.

The second radio frequency component 24J is the power amplifier 11A, for example. The second radio frequency component 24J is a one-chip electronic component including a substrate 241J and an IC portion (not illustrated) including an FET formed on the side of a first main surface 2411) of the substrate 241J, for example. The substrate 241J is a silicon substrate, for example. The IC portion is a functional portion having a function of amplifying a transmission signal.

The second radio frequency component 24J further includes a plurality of (two in the illustrated example) signal terminals 242J and a ground terminal 243J. The plurality of signal terminals 242J is the input terminal and the output terminal of the power amplifier 11A, for example. The ground terminal 243J is connected to a through-electrode 29 penetrating through the mounting substrate 8 in the first direction D1, which is the thickness direction of the mounting substrate 8, and is connected to the ground terminal 235J of the first radio frequency component 23J via the through-electrode 29. Thus, heat generated in the power amplifier 11A may be dissipated to the side of an external substrate via the through-electrode 29 and 233J, and the ground terminal 235J. This may improve heat dissipation performance.

In the radio frequency module 1J according to Embodiment 4, the plurality of signal terminals 234J of the first radio frequency component 23J is disposed on the first main surface 2311J of the piezoelectric substrate 231J. However, the plurality of signal terminals 234J may be disposed on the second main surface 2312J of the piezoelectric substrate 231J. Part of the plurality of signal terminals 234J may be disposed on the first main surface 2311J, and the rest of the plurality of signal terminals 234J may be disposed on the second main surface 2312J.

Embodiment 5

A radio frequency module 1K according to Embodiment 5 will be described with reference to FIG. 10. The radio frequency module 1K according to Embodiment 5 is different from the radio frequency module 1J according to Embodiment 4 in that a first radio frequency component 23K is a switch IC 26K. Other configurations are the same as those of the radio frequency module 1J according to Embodiment 4, and the same constituents are denoted with the same reference signs and the description thereof is omitted.

Figure 10:
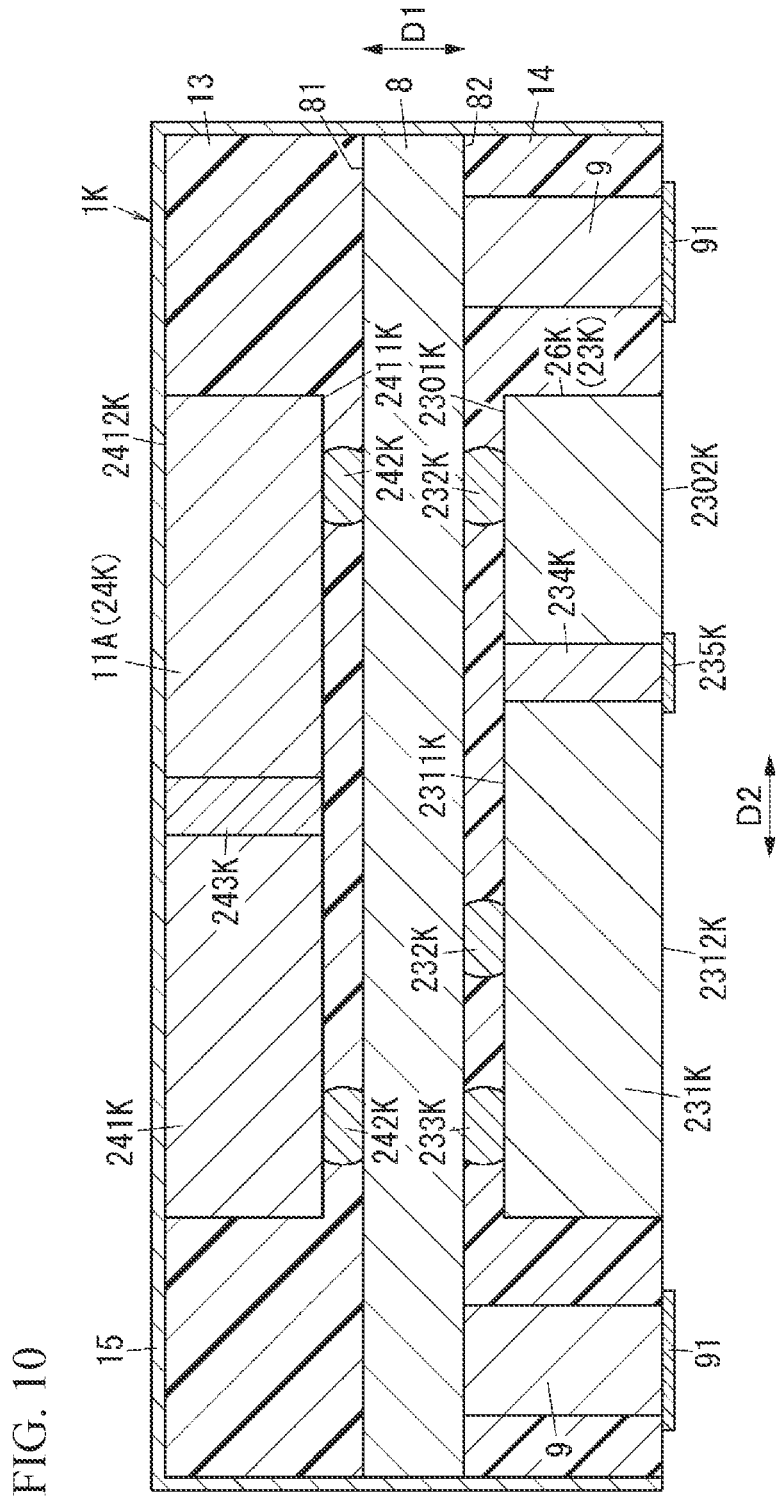
FIG. 10 is a sectional view of a radio frequency module according to Embodiment 5.

As illustrated in FIG. 10, the radio frequency module 1K according to Embodiment 5 includes the mounting substrate 8, the first radio frequency component 23K, and a second radio frequency component 24K. Further, the radio frequency module 1J includes the plurality of (two in the illustrated example) external connection electrodes 9, the first resin layer 13, the second resin layer 14, and the conductive shield layer 15.

As illustrated in FIG. 10, the first radio frequency component 23K is the one-chip switch IC 26K including a substrate 231K and an IC portion (not illustrated) including an FET formed on the side of a first main surface 2311K of the substrate 231K, for example. The switch IC 26K includes the first switch 3, the second switch 4, the third switch 5, the low-noise amplifiers 21A to 21C, and the power amplifier controller 16, for example. The substrate 231K is a silicon substrate, for example. The IC portion is a functional portion having a first function, a second function, and a third function. The first function is a function of amplifying a reception signal. The second function is a function of switching connection states. The third function is a function of controlling the first switch 3, the second switch 4, the third switch 5, and the power amplifiers 11A to 11C.

The first radio frequency component 23K further has a plurality of (two in the illustrated example) signal terminals 232K, a plurality of (in the illustrated example) ground terminals 233K and 235K, and a through-electrode 234K.

The ground terminal 233K (first ground terminal) is connected to the ground of the low-noise amplifiers 21A to 21C, for example. The ground terminal 233K is a solder bump, but may be a gold bump, for example. The ground terminal 233K is disposed on the first main surface 2311K of the substrate 231K.

The ground terminal 235K (second ground terminal) is connected to the ground of the power amplifier controller 16 via the through-electrode 234K. The through-electrode 234K has a first end portion and a second end portion which are two end portions in the first direction D1, which is the thickness direction of the substrate 231K. The first end portion (upper end portion in FIG. 10) of the through-electrode 234K is connected to the ground of the power amplifier controller 16, for example. The second end portion (lower end portion in FIG. 10) of the through-electrode 234K is connected to the ground terminal 235K. The ground terminal 235K is formed of an appropriate metal material, such as copper, nickel, or an alloy containing any of these metals as a main component, for example. The ground terminal 235K is disposed on a second main surface 2312K of the substrate 231K.

In the radio frequency module 1K according to Embodiment 5, as described above, the ground terminal 233K is disposed on the first main surface 2311K of the substrate 231K, and the ground terminal 235K is disposed on the second main surface 2312K of the substrate 231K. Thus, the isolation between an RF signal passing through the low-noise amplifiers 21A to 21C and a control signal from the power amplifier controller 16 may be improved.

The second radio frequency component 24K is the power amplifier 11A, for example. As illustrated in FIG. 10, the second radio frequency component 24K is a one-chip electronic component including a substrate 241K and an IC portion (not illustrated) including an FET formed on the side of a first main surface 2411K of the substrate 241K, for example. The substrate 241K is a silicon substrate, for example. The IC portion is a functional portion having a function of amplifying a transmission signal.

The second radio frequency component 24K further includes a plurality of (two in the illustrated example) signal terminals 242K and a through-electrode 243K. The plurality of signal terminals 242K is the input terminal and the output terminal of the power amplifier 11A, for example. The through-electrode 243K has a first end portion and a second end portion which are two end portions of the through-electrode 243K in the first direction D1, which is the thickness direction of the substrate 241K. The first end portion (lower end portion in FIG. 10) of the through-electrode 243K is connected to the ground of the power amplifier 11A, for example. The second end portion (upper end portion in FIG. 10) of the through-electrode 243K is connected to the conductive shield layer 15.

In the radio frequency module 1K according to Embodiment 5, the plurality of signal terminals 232K of the first radio frequency component 23K is disposed on the first main surface 2311K of the substrate 231K. However, the plurality of signal terminals 232K may be disposed on the second main surface 2312K of the substrate 231K. Part of the plurality of signal terminals 232K may be disposed on the first main surface 2311K, and the rest of the plurality of signal terminals 232K may be disposed on the second main surface 2312K.

(Aspects)

The following aspects are disclosed from the embodiments and the like described above.

A radio frequency module (1) according to a first aspect includes a mounting substrate (8), a radio frequency component (23), and an external connection electrode (9). The mounting substrate (8) has a first main surface (81) and a second main surface (82) opposed to each other. The radio frequency component (23) has a signal terminal (237) and a ground terminal (238) and is provided on the second main surface (82). The external connection electrode (9) is provided on the second main surface (82). The radio frequency component (23) has a third main surface (2301) and a fourth main surface (2302) opposed to each other. The signal terminal (237) is provided on the third main surface (2301). The ground terminal (238) is provided on the fourth main surface (2302).

According to this aspect, the number of terminals disposed on the third main surface (2301) may be reduced as compared with a case in which the ground terminal (238) is provided on the third main surface (2301) of the radio frequency component (23). This makes it possible to reduce the radio frequency component (23) in size.

In the radio frequency module (1) according to a second aspect, the third main surface (2301) is positioned between the second main surface (82) and the fourth main surface (2302) in a thickness direction (D1) of the mounting substrate (8), in the first aspect.

According to this aspect, since the ground terminal (238) is provided on the side of an external substrate to be connected via the external connection electrode (9), the distance to a ground on the external substrate may be shortened.

In the radio frequency module (1) according to a third aspect, the radio frequency component (23) is any one of low-noise amplifiers (21A to 21C), power amplifiers (11A to 11C), a power amplifier controller (16), switches (3, 4, and 5), and filters (12A to 12C, and 22A to 22C) in the first or second aspect. The low-noise amplifiers (21A to 21C) amplify a reception signal from an antenna terminal (100). The power amplifiers (11A to 11C) amplify a transmission signal to the antenna terminal (100). The power amplifier controller (16) controls the power amplifiers (11A to 11C). The switches (3, 4, and 5) switch a signal path of a reception signal or a transmission signal. The filters (12A to 12C and 22A to 22C) pass at least one of the reception signal and the transmission signal.

In a radio frequency module (1C) according to a fourth aspect, a radio frequency component (23C) is a filter (2A) in the third aspect. The filter (2A) includes a piezoelectric layer (239C), an IDT electrode (232C), a high acoustic velocity support substrate (231C), and a low acoustic velocity film (251C). The IDT electrode (232C) is provided on the piezoelectric layer (239C). The high acoustic velocity support substrate (231C) is positioned on the opposite side from the IDT electrode (232C) across the piezoelectric layer (239C) in the thickness direction (D1) of the mounting substrate (8). In the high acoustic velocity support substrate (231C), the acoustic velocity of a bulk wave propagating therethrough is higher than the acoustic velocity of an acoustic wave propagating through the piezoelectric layer (239C). The low acoustic velocity film (251C) is provided between the high acoustic velocity support substrate (231C) and the piezoelectric layer (239C) in the thickness direction (D1) of the mounting substrate (8). In the low acoustic velocity film (251C), the acoustic velocity of a bulk wave propagating therethrough is lower than the acoustic velocity of a bulk wave propagating through the piezoelectric layer (239C).

In a radio frequency module (1C) according to a fifth aspect, the piezoelectric layer (239C) is positioned between the mounting substrate (8) and the high acoustic velocity support substrate (231C) in the thickness direction (D1) of the mounting substrate (8) in the fourth aspect.

In a radio frequency module (1D) according to a sixth aspect, a radio frequency component (23D) is the filter (2A) in the third aspect. The filter (2A) includes a piezoelectric layer (239D), an IDT electrode (232D), a support substrate (231D), a low acoustic velocity film (251D), and a high acoustic velocity film (253D). The IDT electrode (232D) is provided on the piezoelectric layer (239D). The support substrate (231D) is positioned on the opposite side from the IDT electrode (232D) across the piezoelectric layer (239D) in the thickness direction (D1) of the mounting substrate (8). The low acoustic velocity film (251D) is provided between the support substrate (231D) and the piezoelectric layer (239D) in the thickness direction (D1) of the mounting substrate (8). In the low acoustic velocity film (251D), the acoustic velocity of a bulk wave propagating therethrough is lower than the acoustic velocity of a bulk wave propagating through the piezoelectric layer (239D). The high acoustic velocity film (253D) is provided between the low acoustic velocity film (251D) and the support substrate (231D) in the thickness direction (D1) of the piezoelectric layer (239D). In the high acoustic velocity film (253D), the acoustic velocity of a bulk wave propagating therethrough is higher than the acoustic velocity of an acoustic wave propagating through the piezoelectric layer (239D).

In a radio frequency module (1D) according to a seventh aspect, the piezoelectric layer (239D) is positioned between the mounting substrate (8) and the support substrate (231D) in the thickness direction (D1) of the mounting substrate (8) in the sixth aspect.

In a radio frequency module (1J) according to an eighth aspect, the radio frequency component (23J) is the duplexer (2A) including the reception filter (22A) that passes a reception signal inputted to the antenna terminal (100) and the transmission filter (12A) that passes a transmission signal to be outputted from the antenna terminal (100) in the first or second aspect. The radio frequency component (23J) has a first ground terminal (235J) that is a ground terminal of the transmission filter (12A) and has a second ground terminal (237J), as the ground terminal, that is a ground terminal of the reception filter (22A). The first ground terminal (235J) is provided on a third main surface (2301J). The second ground terminal (237J) is provided on a fourth main surface (2302J).

According to this aspect, the first ground terminal (235J) serving as the ground terminal of the transmission filter (12A) is provided on the third main surface (2301J) of the radio frequency component (23J), and the second ground terminal (237J) serving as the ground terminal of the reception filter (22A) is provided on the fourth main surface (2302J) of the radio frequency component (23J). Thus, isolation between a transmission signal passing through the transmission filter (12A) and a reception signal passing through the reception filter (22A) may be improved as compared with a case in which the first ground terminal (235J) and the second ground terminal (237J) are provided on the same main surface (third main surface 2301) or fourth main surface 2302J).

A radio frequency module (1J) according to a ninth aspect further includes the power amplifier (11A) and a through-electrode (29) in the eighth aspect. The power amplifier (11A) is provided on the first main surface (81). The through-electrode (29) is connected to a ground terminal (243J) of the power amplifier (11A), and penetrates through the mounting substrate (8) in the thickness direction (D1) of the mounting substrate (8). In the radio frequency module (1J), the third main surface (2301J) is positioned between the second main surface (82) and the fourth main surface (2302J) in the thickness direction (D1) of the mounting substrate (8). The first ground terminal (235J) is connected to the through-electrode (29).

According to this aspect, since the heat generated in the power amplifier (11A) may be dissipated via the through-electrode (29), the heat dissipation performance of the power amplifier (11A) may be improved. Further, it is possible to improve the isolation between a transmission signal and a reception signal as compared with a case in which the first ground terminal (235J) and the second ground terminal (237J) are provided on the same main surface (third main surface 2301) or fourth main surface 2302J).

In a radio frequency module (1K) according to a tenth aspect, the radio frequency component (23K) includes a circuit component (first switch 3, for example) and a control IC (power amplifier controller 16, for example) in the first or second aspect. The circuit component is at least one of the low-noise amplifiers (21A to 21C) that amplify a reception signal inputted to the antenna terminal (100) and switches (3, 4, and 5) that switch a signal path of the reception signal. The control IC controls the circuit component. The radio frequency component (23K) has a first ground terminal (233K) that is a ground terminal of the circuit component and has a second ground terminal (235K), as the ground terminal, that is a ground terminal of the control IC. The first ground terminal (233K) is provided on a third main surface (2301K). The second ground terminal (235K) is provided on a fourth main surface (2302K).

According to this aspect, the first ground terminal (233K) that is the ground terminal of the circuit component is provided on the third main surface (2301K) of the radio frequency component (23K), and the second ground terminal (235K) that is the ground terminal of the control IC is provided on the fourth main surface (2302K) of the radio frequency component (23K). Thus, the isolation between a signal to/from the circuit component and a signal to/from the control IC may be improved as compared with a case in which the first ground terminal (233K) and the second ground terminal (235K) are provided on the same main surface (third main surface 2301K or fourth main surface 2302K).

A radio frequency module (1) according to an eleventh aspect further includes a second radio frequency component (24) provided on the first main surface (81) and different from the first radio frequency component (23) as a radio frequency component in any one of the first to tenth aspects.

According to this aspect, it is possible to reduce the mounting substrate (8) in size as compared with a case in which a radio frequency component is provided only on one main surface (first main surface 81 or second main surface 82) of the mounting substrate (8).

A communication device (10) according to a twelfth aspect includes the radio frequency module (1) according to any one of the first to eleventh aspects and a signal processing circuit (6). The signal processing circuit (6) processes at least one of a reception signal inputted to the antenna terminal (100) and a transmission signal to be outputted from the antenna terminal (100).

According to this aspect, the number of terminals disposed on the third main surface (2301) may be reduced as compared with a case in which the ground terminal (238) is provided on the third main surface (2301) of the radio frequency component (23). This makes it possible to reduce the radio frequency component (23) in size.

An acoustic wave device (23) according to a thirteenth aspect includes a piezoelectric substrate (231), an IDT electrode (232), the signal terminal (237), and the ground terminal (238). The piezoelectric substrate (231) has two main surfaces (2311 and 2312) opposed to each other. The IDT electrode (232) is provided on the piezoelectric substrate (231). The signal terminal (237) is provided on the side of one (2311) of the two main surfaces (2311 and 2312) in the thickness direction (D1) of the piezoelectric substrate (231). The ground terminal (238) is provided on the side of the other (2312) of the two main surfaces (2311 and 2312) in the thickness direction (D1) of the piezoelectric substrate (231).

According to this aspect, it is possible to reduce the number of terminals disposed on the one main surface (2311) as compared with a case in which the ground terminal (238) is provided on the one main surface (2311) of the piezoelectric substrate (231). This makes it possible to reduce the acoustic wave device (23) in size.

REFERENCE SIGNS LIST 1, 1A to 1K RADIO FREQUENCY MODULE
2A to 2C DUPLEXER
3 FIRST SWITCH
4 SECOND SWITCH
5 THIRD SWITCH
6 SIGNAL PROCESSING CIRCUIT
7 ANTENNA
8 MOUNTING SUBSTRATE
9, 9a EXTERNAL CONNECTION ELECTRODE
10 COMMUNICATION DEVICE
11A to 11C POWER AMPLIFIER
12A FIRST TRANSMISSION FILTER
12B SECOND TRANSMISSION FILTER
12C THIRD TRANSMISSION FILTER
13 FIRST RESIN LAYER
14 SECOND RESIN LAYER
15 CONDUCTIVE SHIELD LAYER
16 POWER AMPLIFIER CONTROLLER
22A FIRST RECEPTION FILTER
22B SECOND RECEPTION FILTER
22C THIRD RECEPTION FILTER
23, 23A to 23K FIRST RADIO FREQUENCY COMPONENT (RADIO FREQUENCY COMPONENT)
24, 24J, 24K SECOND RADIO FREQUENCY COMPONENT
26, 26K SWITCH IC
27, 28 INDUCTOR
29 THROUGH-ELECTRODE
30 COMMON TERMINAL
31 to 33 SELECTION TERMINAL
40 COMMON TERMINAL
41, 42 SELECTION TERMINAL
50 COMMON TERMINAL
51 to 53 SELECTION TERMINAL
61 RF SIGNAL PROCESSING CIRCUIT
62 BASEBAND SIGNAL PROCESSING CIRCUIT
81 FIRST MAIN SURFACE
82 SECOND MAIN SURFACE
91, 92 EXTERNAL CONNECTION TERMINAL
100 ANTENNA TERMINAL
101 FIRST INPUT TERMINAL
102 SECOND INPUT TERMINAL
103 OUTPUT TERMINAL
104 CONTROL TERMINAL
121A to 121C INPUT TERMINAL
122A to 122C OUTPUT TERMINAL
221A to 221C INPUT TERMINAL
222A to 222C OUTPUT TERMINAL
231, 231A, 231F, 231J, 231K, 241 PIEZOELECTRIC SUBSTRATE
231B, 231E, 231G, 241J, 241K SUBSTRATE
231C HIGH ACOUSTIC VELOCITY SUPPORT SUBSTRATE
231D SUPPORT SUBSTRATE
232, 232A, 232C, 232D, 232F, 232J, 242 IDT ELECTRODE
233, 233C, 233D SPACER LAYER
234, 234C, 234D COVER LAYER
232B, 232E, 232G, 233A, 233F, 233J, 234K, 235, 235C, 235D, 236, 236C, 236D, 236J, 243K, 244 THROUGH-ELECTRODE
232K, 233B, 233E, 233G, 234A, 234F, 234J, 237, 237C, 237D, 242J, 242K, 243 SIGNAL TERMINAL
233K, 234B, 234E, 234G, 235A, 235F, 235J, 235K, 237J, 238, 238C, 238D, 243J GROUND TERMINAL
238J EXTERNAL CONNECTION TERMINAL
239C, 239D PIEZOELECTRIC LAYER
251C, 251D LOW ACOUSTIC VELOCITY FILM
252C, 252D WIRING LAYER
253D HIGH ACOUSTIC VELOCITY FILM
2301, 2301A to 2301K THIRD MAIN SURFACE
2302, 2302A to 2302K FOURTH MAIN SURFACE
2311, 2311A, 2311B, 2311C, 2311D, 2311E, 2311F, 2311G, 2311J, 2311K, 2341, 2341C, 2341D, 2411, 2411J, 2411K FIRST MAIN SURFACE
2312, 2312A, 2312B, 2312C, 2312D, 2312E, 2312F, 2312G, 2312J, 2312K, 2342, 2342C, 2342D, 2412, 2412J, 2412K SECOND MAIN SURFACE
2331 THROUGH-HOLE
S1, S2 SPACE
D1 FIRST DIRECTION (THICKNESS DIRECTION)
D2 SECOND DIRECTION

The invention claimed is:
1. A radio frequency module, comprising:
a mounting substrate having a first main surface and a second main surface opposite to the first main surface;
a radio frequency circuit component having a signal terminal and a ground terminal, the radio frequency circuit component being mounted on the second main surface; and
an external connection electrode on the second main surface,
wherein the radio frequency circuit component has a third main surface facing the second main surface of the mounting substrate and a fourth main surface opposite the third main surface,
wherein the signal terminal is on the third main surface,
wherein the ground terminal is on the fourth main surface,
wherein the radio frequency circuit component is a filter configured to allow a reception signal or a transmission signal to pass through,
wherein the filter comprises:
- a piezoelectric layer,
- an interdigital transducer (IDT) electrode on the piezoelectric layer,
- a high acoustic velocity support substrate on an opposite side of the piezoelectric layer than the IDT electrode in a thickness direction of the mounting substrate, and
- a low acoustic velocity film between the high acoustic velocity support substrate and the piezoelectric layer in the thickness direction of the mounting substrate, wherein bulk waves propagate through the high acoustic velocity film at a greater acoustic velocity than acoustic waves propagate through the piezoelectric layer, and
wherein bulk waves propagate through the low acoustic velocity film at a lower acoustic velocity than bulk waves propagate through the piezoelectric layer.

2. The radio frequency module according to claim 1, wherein the third main surface is between the second main surface and the fourth main surface in a thickness direction of the mounting substrate.

3. The radio frequency module according to claim 1, wherein the piezoelectric layer is between the mounting substrate and the high acoustic velocity support substrate in the thickness direction of the mounting substrate.

4. The radio frequency module according to claim 1,
wherein the radio frequency circuit component further comprises a duplexer that comprises a reception filter configured to pass a reception signal inputted to an antenna terminal and a transmission filter configured to pass a transmission signal outputted from the antenna terminal,
wherein the radio frequency circuit component has:
- a first ground terminal that is a ground terminal of the transmission filter and
- a second ground terminal that is a ground terminal of the reception filter,
wherein the first ground terminal is on the third main surface, and
wherein the second ground terminal is the ground terminal on the fourth main surface.

5. The radio frequency module according to claim 4, further comprising:
a power amplifier on the first main surface; and
a through-electrode connected to a ground terminal of the power amplifier and penetrating through the mounting substrate in a thickness direction of the mounting substrate,
wherein the third main surface is between the second main surface and the fourth main surface in the thickness direction of the mounting substrate, and
the first ground terminal is connected to the through-electrode.

6. The radio frequency module according to claim 1,
wherein the radio frequency circuit component further comprises:
- a low-noise amplifier configured to amplify a reception signal inputted to an antenna terminal, or a switch configured to switch a signal path of the reception signal, and
- a control integrated circuit (IC) that is configured to control the low-noise amplifier or the switch,
wherein the radio frequency circuit component has:
- a first ground terminal that is a ground terminal of the circuit component and
- a second ground terminal that is a ground terminal of the control IC,
wherein the first ground terminal is on the third main surface, and
wherein the second ground terminal is the ground terminal on the fourth main surface.

7. The radio frequency module according to claim 1, further comprising:
a second radio frequency circuit component on the first main surface, the second radio frequency circuit component being a different type of circuit component than the first radio frequency circuit component.

8. A communication device, comprising:
the radio frequency module according to claim 1; and
a signal processing circuit configured to process a reception signal inputted to an antenna terminal or a transmission signal outputted from the antenna terminal.

* * * * *